US011722165B2

(12) United States Patent
Zhan et al.

(10) Patent No.: US 11,722,165 B2
(45) Date of Patent: *Aug. 8, 2023

(54) RADIO FREQUENCY SIGNAL BOOSTERS FOR VEHICLES

(71) Applicant: Cellphone-Mate, Inc., Fremont, CA (US)

(72) Inventors: Hongtao Zhan, Fremont, CA (US); Xulei Lin, Shenzhen (CN); Scott Terry, Pleasanton, CA (US)

(73) Assignee: Cellphone-Mate, Inc., Fremont, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 17/301,047

(22) Filed: Mar. 23, 2021

(65) Prior Publication Data

US 2021/0351804 A1 Nov. 11, 2021

Related U.S. Application Data

(63) Continuation of application No. 16/814,717, filed on Mar. 10, 2020, now Pat. No. 10,992,332, which is a (Continued)

(51) Int. Cl.
*H04B 1/3822* (2015.01)
*H04B 7/155* (2006.01)
(Continued)

(52) U.S. Cl.
CPC ......... *H04B 1/3822* (2013.01); *H03G 3/3042* (2013.01); *H04B 1/0057* (2013.01);
(Continued)

(58) Field of Classification Search
CPC ...... H04B 1/3822; H04B 1/0057; H04B 1/40; H04B 3/548; H04B 7/15535; H03G 3/3042
(Continued)

(56) References Cited

U.S. PATENT DOCUMENTS 6,329,949 B1 12/2001 Barnett
6,570,858 B1 5/2003 Emmons et al.
(Continued)

FOREIGN PATENT DOCUMENTS

CN 101670810 A 3/2010
CN 105409298 A 3/2016
(Continued)

OTHER PUBLICATIONS

Cellphone-Mate Force-5 Manual, Apr. 30, 2012, in 36 pages (available at World Wide Web page: transition.fcc.gov/oet/ea/fccid/).
(Continued)

*Primary Examiner* — Ayodeji O Ayotunde
(74) *Attorney, Agent, or Firm* — Knobbe, Martens, Olson & Bear, LLP

(57) ABSTRACT

Apparatus and methods for signal boosters for vehicles are provided. In certain embodiments, a vehicle signal booster system includes an interior unit including a mobile station antenna that receives an RF uplink signal and transmits a boosted RF downlink signal. The vehicle signal booster system further includes a top unit including a base station antenna that receives an RF downlink signal and transmits a boosted RF uplink signal. The vehicle signal booster system further includes booster circuitry that generates the boosted RF downlink signal based on amplifying one or more downlink channels of the RF downlink signal, and that generates the boosted RF uplink signal based on amplifying one or more uplink channels of the RF uplink signal. The booster circuitry is implemented in the top unit or in the top unit and the interior unit.

20 Claims, 16 Drawing Sheets

Related U.S. Application Data continuation of application No. 16/059,465, filed on Aug. 9, 2018, now Pat. No. 10,623,036.

(60) Provisional application No. 62/699,533, filed on Jul. 17, 2018, provisional application No. 62/561,333, filed on Sep. 21, 2017, provisional application No. 62/544,345, filed on Aug. 11, 2017.

(51) Int. Cl.

| | | |
|---|---|---|
| *H04Q 1/02* | (2006.01) | |
| *H04B 3/54* | (2006.01) | |
| *H04Q 1/08* | (2006.01) | |
| *H03G 3/30* | (2006.01) | |
| *H04B 1/00* | (2006.01) | |
| *H04B 1/40* | (2015.01) | |
| *H04B 3/58* | (2006.01) | |
| *B60L 1/00* | (2006.01) | |
| *B60R 16/033* | (2006.01) | |

(52) U.S. Cl.
CPC ............... *H04B 1/40* (2013.01); *H04B 3/548* (2013.01); *H04B 7/15535* (2013.01); *H04Q 1/02* (2013.01); *H04Q 1/08* (2013.01); *B60L 1/00* (2013.01); *B60R 16/033* (2013.01); *H04B 3/58* (2013.01)

(58) Field of Classification Search
USPC ........................................................ 455/571
See application file for complete search history.

(56) References Cited

U.S. PATENT DOCUMENTS

| | | | |
|---|---|---|---|
| 6,731,904 B1 | 5/2004 | Judd | |
| 6,864,853 B2 | 3/2005 | Judd | |
| 7,009,573 B2 | 3/2006 | Hornsby et al. | |
| 7,565,106 B1 | 7/2009 | Oh et al. | |
| 7,729,656 B2 | 6/2010 | Van Buren | |
| 7,783,318 B2 | 8/2010 | Wilson et al. | |
| 7,813,314 B2 | 10/2010 | Fulknier | |
| 8,005,513 B2 | 8/2011 | Risheq et al. | |
| 8,023,885 B2 | 9/2011 | Proctor, Jr. et al. | |
| 8,027,636 B2 | 9/2011 | Demarco et al. | |
| 8,244,173 B2 | 8/2012 | Moon | |
| 8,265,546 B2 | 9/2012 | Wang et al. | |
| 8,498,234 B2 | 7/2013 | Proctor | |
| 8,867,572 B1 | 10/2014 | Zhan | |
| 8,971,796 B2 | 3/2015 | Judd | |
| 9,100,839 B2 | 8/2015 | Zhan | |
| 9,432,852 B2 | 8/2016 | Zhan et al. | |
| 9,444,543 B2 | 9/2016 | Ashworth et al. | |
| 9,775,051 B2 | 9/2017 | Zhan | |
| 10,236,921 B1 | 3/2019 | Kohlhepp | |
| 10,523,160 B2 | 12/2019 | Ashworth | |
| 10,623,036 B2 | 4/2020 | Zhan et al. | |
| 10,630,374 B2 | 4/2020 | Ashworth | |
| 10,637,557 B2 | 4/2020 | Ashworth | |
| 10,659,142 B1 | 5/2020 | Nordgran et al. | |
| 10,784,952 B2 | 9/2020 | Huang et al. | |
| 10,992,332 B2* | 4/2021 | Zhan ........................ | H04Q 1/02 |
| 11,329,684 B2 | 5/2022 | Zhan et al. | |
| 2002/0034958 A1 | 3/2002 | Oberschmidt | |
| 2004/0110469 A1 | 6/2004 | Judd et al. | |
| 2004/0160376 A1 | 8/2004 | Hornsby et al. | |
| 2004/0166802 A1 | 8/2004 | McKay, Sr. et al. | |
| 2004/0192194 A1 | 9/2004 | Zhen | |
| 2005/0118949 A1 | 6/2005 | Allen et al. | |
| 2005/0227652 A1 | 10/2005 | Kang et al. | |
| 2006/0164318 A1 | 7/2006 | Lastinger et al. | |
| 2006/0205342 A1 | 9/2006 | McKay, Sr. et al. | |
| 2006/0205343 A1 | 9/2006 | Runyon | |
| 2007/0071128 A1 | 3/2007 | Meir et al. | |
| 2008/0039012 A1 | 2/2008 | McKay et al. | |

| | | |
|---|---|---|
| 2008/0081555 A1 | 4/2008 | Kong et al. |
| 2008/0225758 A1 | 9/2008 | Proctor |
| 2008/0233865 A1 | 9/2008 | Malarky et al. |
| 2010/0029197 A1 | 2/2010 | Judd |
| 2010/0075596 A1 | 3/2010 | Demarco et al. |
| 2010/0197222 A1 | 8/2010 | Scheucher |
| 2010/0202325 A1 | 8/2010 | Poulin et al. |
| 2012/0034954 A1 | 2/2012 | Tabe |
| 2012/0257051 A1 | 10/2012 | Cheng |
| 2012/0302188 A1 | 11/2012 | Sahota et al. |
| 2013/0203404 A1 | 8/2013 | Cook |
| 2013/0222201 A1 | 8/2013 | Ma |
| 2013/0242852 A1 | 9/2013 | Petros |
| 2013/0322395 A1 | 12/2013 | Kazmi et al. |
| 2014/0016525 A1 | 1/2014 | Yoshizawa |
| 2014/0038531 A1 | 2/2014 | Hisao et al. |
| 2014/0134944 A1 | 5/2014 | Schwengler |
| 2014/0184455 A1 | 7/2014 | Lea et al. |
| 2014/0187173 A1 | 7/2014 | Partee |
| 2014/0292593 A1 | 10/2014 | Thiam et al. |
| 2014/0321353 A1 | 10/2014 | Zhan |
| 2015/0008992 A1 | 1/2015 | Black |
| 2015/0130667 A1 | 5/2015 | Koskiniemi |
| 2015/0311591 A1 | 10/2015 | Golombek |
| 2016/0036403 A1 | 2/2016 | Ashworth et al. |
| 2016/0198347 A1 | 7/2016 | Zhan |
| 2017/0093525 A1 | 3/2017 | Navid |
| 2017/0111864 A1 | 4/2017 | Ashworth et al. |
| 2018/0070323 A1 | 3/2018 | Zhan |
| 2018/0077585 A1 | 3/2018 | Zhan |
| 2018/0139708 A1 | 3/2018 | Zhan |
| 2020/0044618 A1 | 2/2020 | Terry et al. |
| 2020/0287614 A1 | 9/2020 | Judd et al. |
| 2020/0350941 A1 | 11/2020 | Zhan et al. |
| 2020/0350943 A1 | 11/2020 | Zhan et al. |
| 2021/0194114 A1 | 6/2021 | Caren et al. |

FOREIGN PATENT DOCUMENTS

| | | |
|---|---|---|
| EP | 2 226 890 A1 | 9/2010 |
| WO | WO 2007/109381 A2 | 9/2007 |

OTHER PUBLICATIONS

CETECOM Annex 1: Measurement Diagrams to Test Report No. 15-1-0046901-01a, in 16 pages, dated Mar. 31, 2016 (available at World Wide Web page: apps.fcc.gov/oetcf/eas/reports/ViewExhibitReport.cfm?mode=Exhibits&RequestTimeout=500&calledFromFrame=N&application_id=%2BDihVrSoXM-Nf7NBHMOSypQ%3D%3D&fcc_id=2ACC7LTECOMPB0).

CETECOM Test Report No. 15-1-0046901-01a According to FCC Regulations Part 20, Section 20.21 for Kathrein Automotive GmbH & Co. KG, in 18 pages, dated Mar. 31, 2016 (available at World Wide Web page: apps.fcc.gov/oetcf/eas/reports/ViewExhibitReport.cfm?mode=Exhibits&RequestTimeout=500&calledFromFrame=N&application_id=%2BDihVrSoXMNf7NBHMOSypQ%3D%3D&fcc_id=2ACC7LTECOMPB0).

CETECOM Test Report No. 3-20835062-C, in 187 pages, dated Mar. 31, 2016 (available at World Wide Web page: apps.fcc.gov/oetcf/eas/reports/ViewExhibitReport.cfm?mode=Exhibits&RequestTimeout=500&calledFromFrame=N&application_id=%2BDihVrSoXMNf7NBHMOSypQ%3D%3D&fcc_id=2ACC7LTECOMPB0).

CKC Laboratories, Inc., Addendum EMC Test Report, Report No. 96950-13A, Issue Jul. 14, 2015, made public Jul. 29, 2015 in 217 pages (available at World Wide Web page: transition.fcc.gov/oet/ea/fccid/).

CKC Laboratories, Inc., EMC Test Report, Report No. 96950-14, Issue Jul. 6, 2015, made public Jul. 29, 2015 in 93 pages (available at World Wide Web page: transition.fcc.gov/oet/ea/fccid/).

CKC Laboratories, Inc., EMC Test Report, Report No. 96950-15, Issue Jul. 6, 2015, made public Jul. 29, 2015 in 70 pages (available at World Wide Web page: transition.fcc.gov/oet/ea/fccid/).

(56) References Cited

OTHER PUBLICATIONS

CKC Laboratories, Inc., EMC Test Report, Report No. 96950-16, Part 2, Issue Jul. 6, 2015, made public Jul. 29, 2015 in 86 pages (available at World Wide Web page: transition.fcc.gov/oet/ea/fccid/).
CKC Laboratories, Inc., EMC Test Report, Report No. 96950-16,Part 1, Issue Jul. 6, 2015, made public Jul. 29, 2015 in 115 pages (available at World Wide Web page: transition.fcc.gov/oet/ea/fccid/).
CKC Laboratories, Inc., Radio Frequency Exposure Report, Report No. 96950-22, Issue Jun. 6, 2015, made public Jul. 29, 2015 in 9 pages (available at World Wide Web page: transition.fcc.gov/oet/ea/fccid/).
Hindawi Publishing Corporation International Journal of Antennas and Propagation vol. 2012, Article ID 307616, 7 pages.
IEEE Antennas and Wireless Propagation Letters, vol. 4, 2005, Cavity-Backed Slot Antenna Array for the Repeater System of a Satellite Digital Multimedia Broadcasting Service.
International Search Report and Written Opinion for International Application No. PCT/CN2017/088458 dated Aug. 23, 2017, in 11 pages.
International Search Report and Written Opinion of the International Searching Authority for International Application No. PCT/US2018/045983 dated Nov. 22, 2018, in 14 pages.
Kathrein Automotive Cellular Signal Booster Compensator LTECOMPB0, in 7 pages, dated Mar. 31, 2016 (available at World Wide Web page: apps.fcc.gov/oetcf/eas/reports/ViewExhibitReport.cfm?mode=Exhibits&RequestTimeout=500&calledFromFrame=N&application id=%2BDihVrSoXMNf7NBHMOSypQ%3D%3D&fcc_id=2ACC7LTECOMPB0).
Representative FCC Approval Documents (FCC Identifier RSNWF-HD) for Applicant Name Cellphone-Mate, made public Jul. 29, 2015, in 13 pages (available at World Wide Web page: transition.fcc.gov/oet/ea/fccid/).
SureCall Ez 4G Five-band Home Cellular Signal Booster, in 2 pages, dated Apr. 22, 2016.
SureCall Ez 4G Home Signal Booster Kit User Guide, in 16 pages, dated Jan. 29, 2016.
SureCall Force-7 Industrial User Guide, Made Public Jul. 29, 2015, in 26 pages (available at World Wide Web page: transition.fcc.gov/oet/ea/fccid/).
SureCall Fusion2Go Adjustable 2G, 3G, 4G Vehicle Signal Booster Kit User Guide, in 12 pages, dated Apr. 13, 2015.
SureCall Fusion2Go Voice and Data Cell Phone Signal Booster for Mobile Application, in 2 pages, dated Sep. 8, 2015.
Weboost Drive 4G-S Cellular Signal Booster, in 20 pages, dated Dec. 2015.
Weboost Drive 4G-S Quick Install Guide, in 2 pages, dated Dec. 2016.
Weboost Drive 4G-S Specification Sheet, in 2 pages, dated Dec. 2016.
Wilson AG ProTM Quint Selectable Signal Booster Installation Guide, Sep. 12, 2012 in 16 pages (available at World Wide Web page wilsonelectronics.com).
Wilson Electronics Mobile 4G Cellular Signal Booster 460108, in 8 pages, dated Jan. 2014.
Wilson Sleek 4G Signal Booster Installation Guide, Dec. 4, 2012, in 8 pages (available at World Wide Web page wilsonelectronics.com).
ZBoost-One YX400-P Signal Booster, Jul. 5, 2014 htttps://web.archive.org/web/20140705092719/ http://www.zboost.com/files/YX400-PSpecSheet.pdf.

* cited by examiner

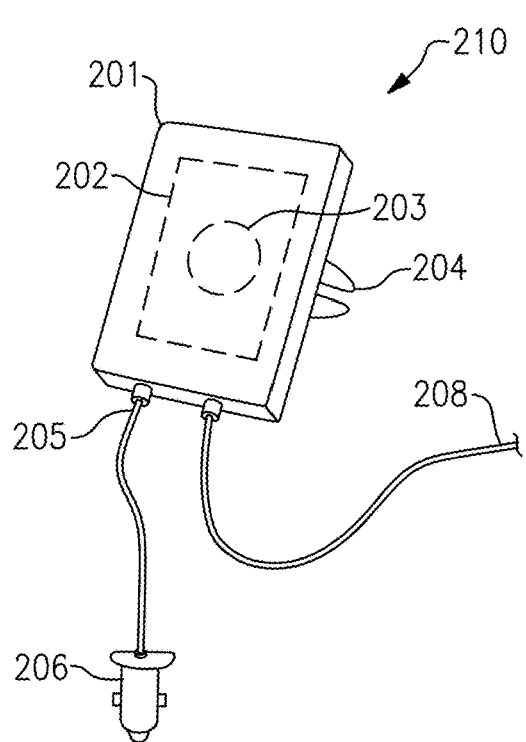 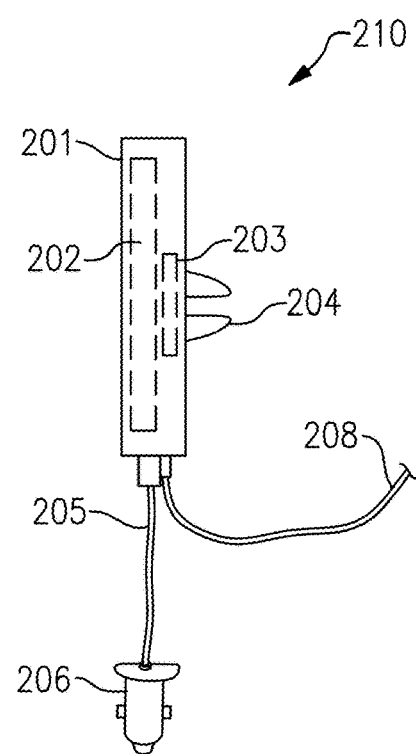
FIG.4A  FIG.4B
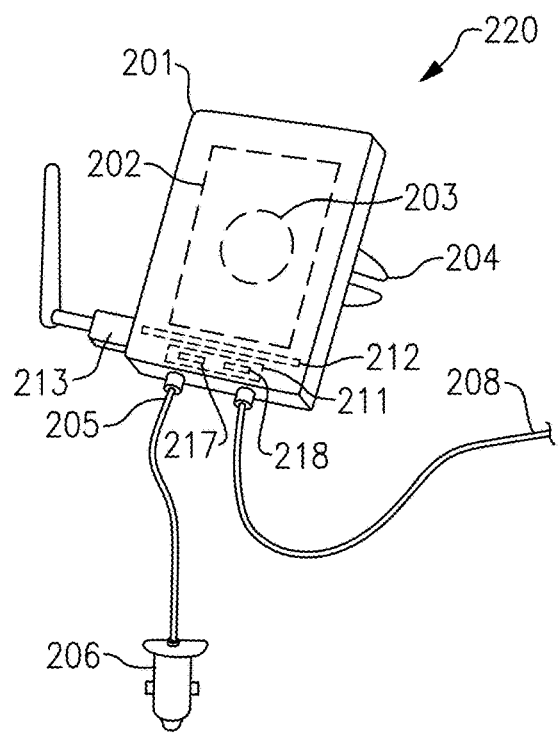
FIG.4C

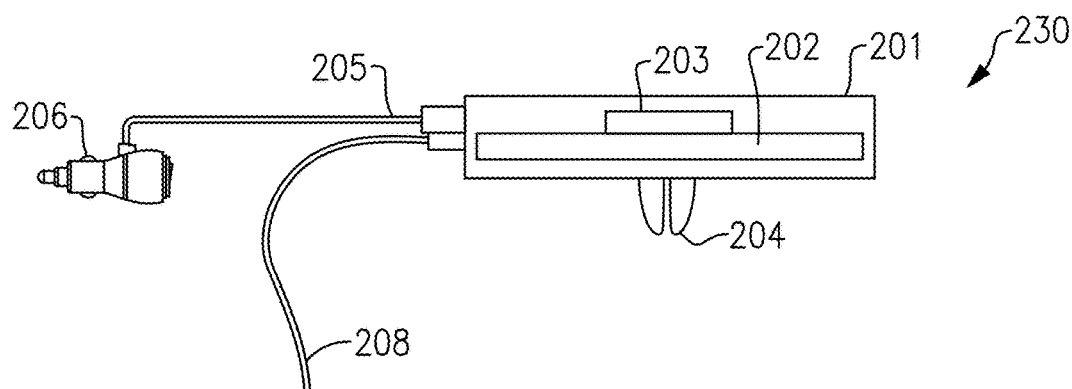
FIG.4D
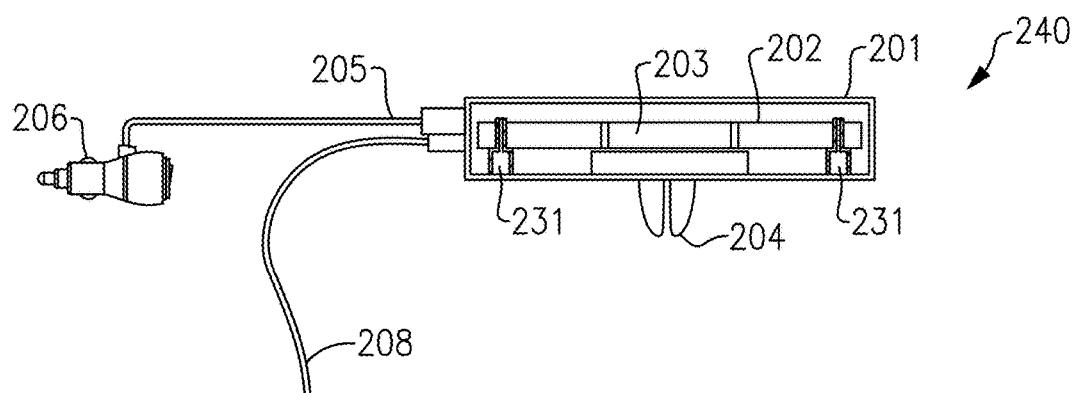
FIG.4E
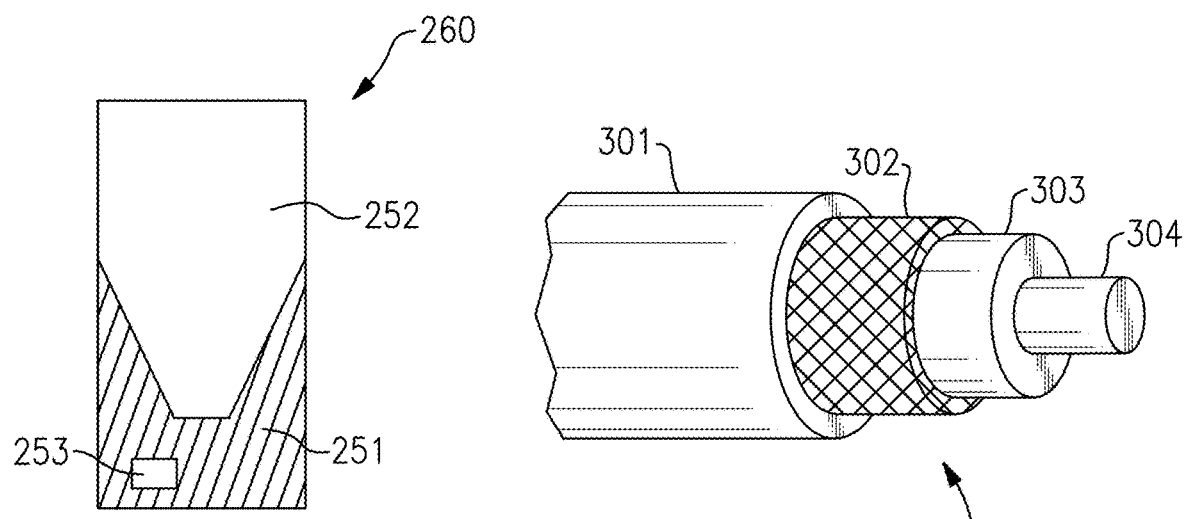
FIG.4F
FIG.5

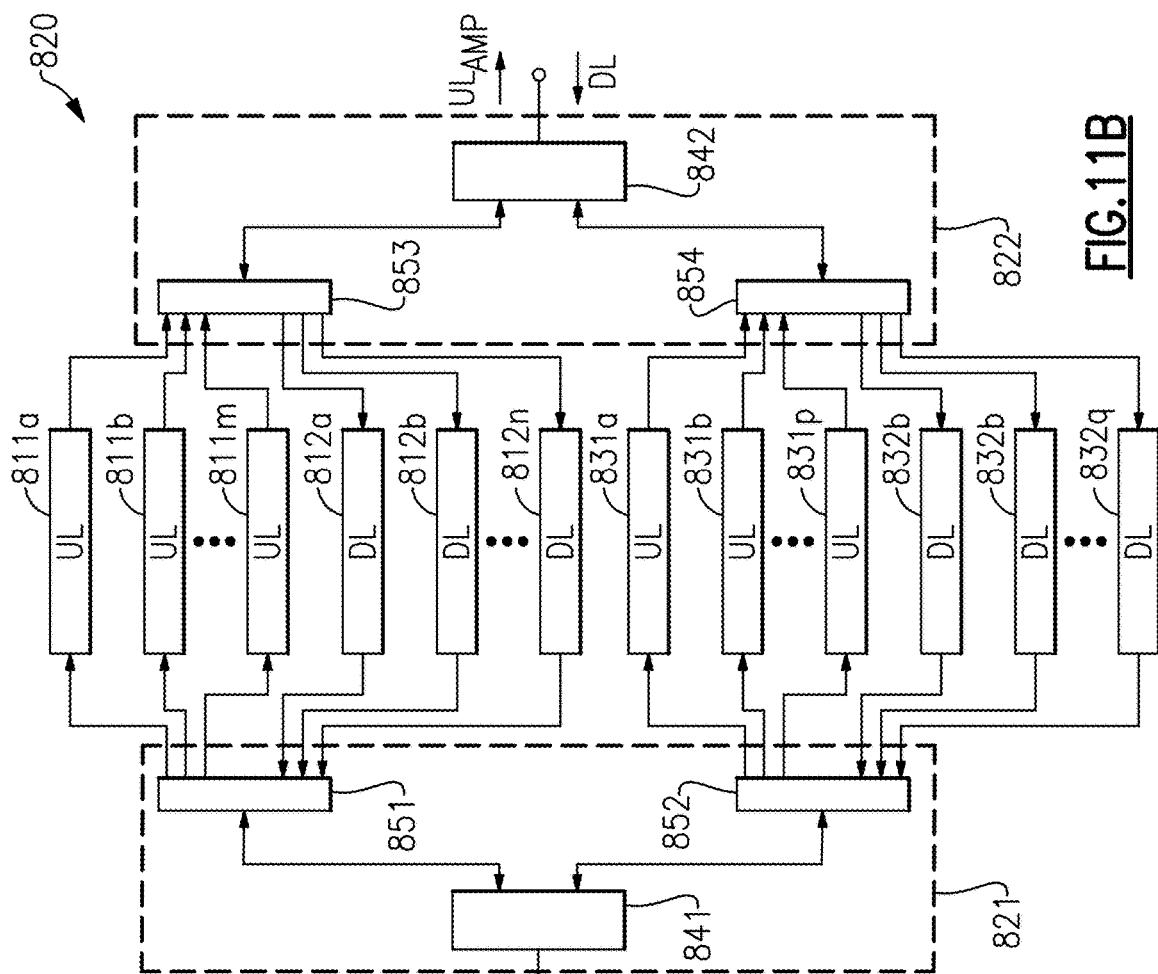
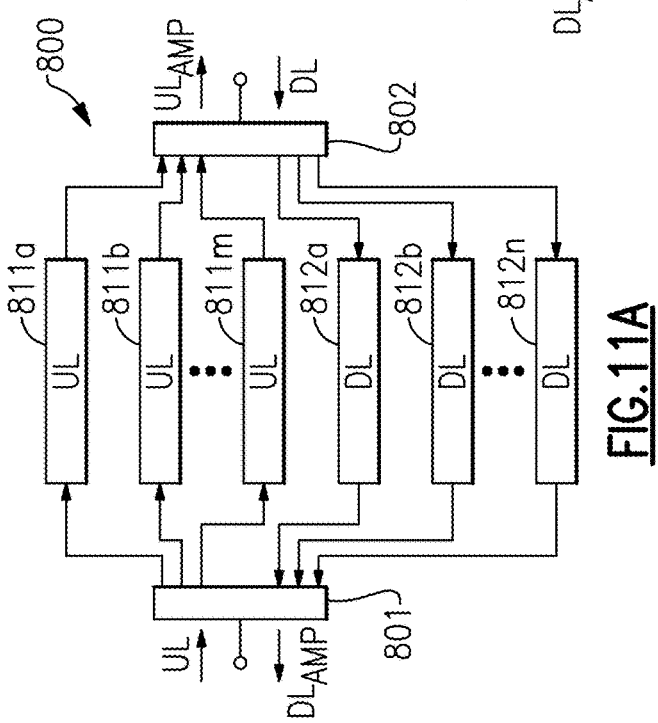
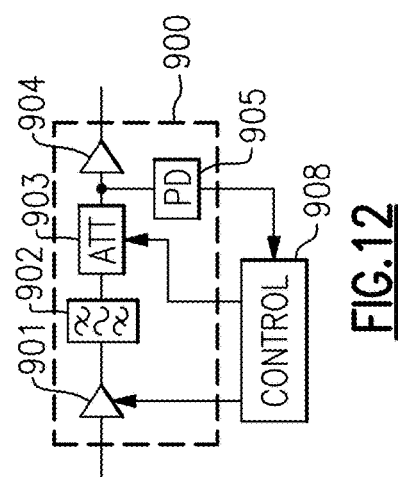

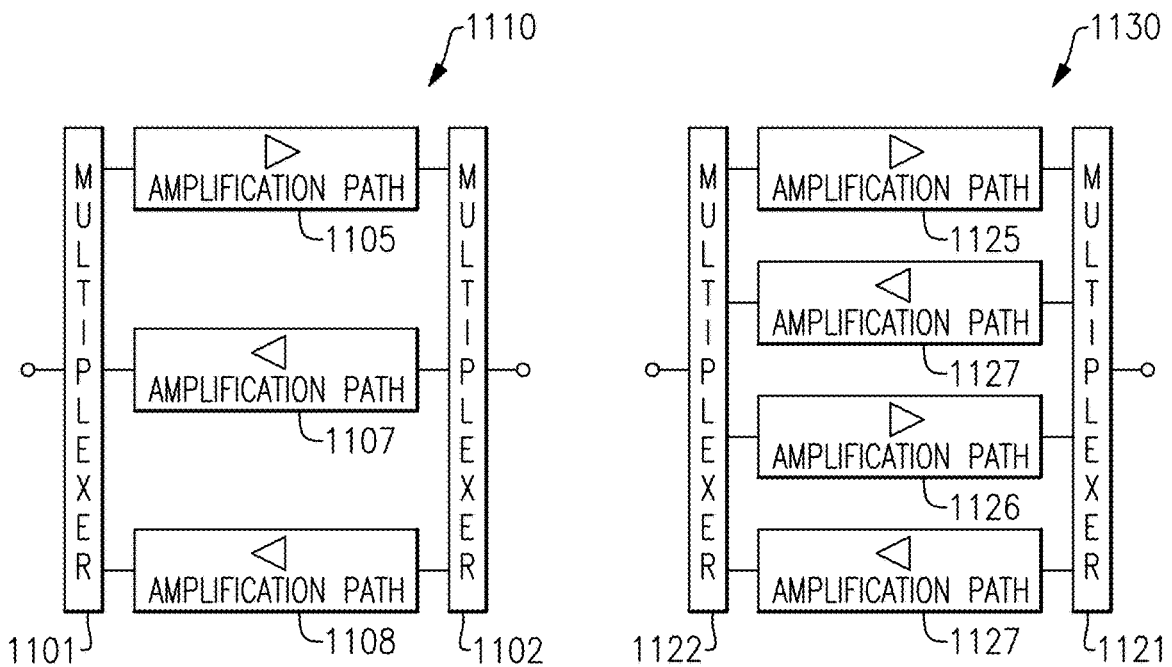
FIG.15A
FIG.15B
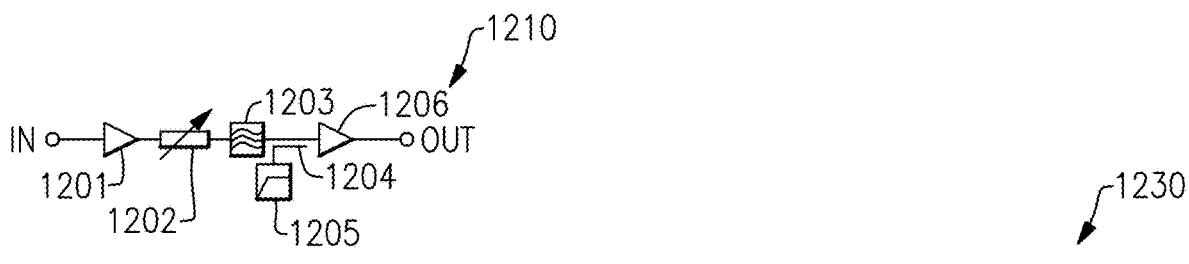
FIG.16A
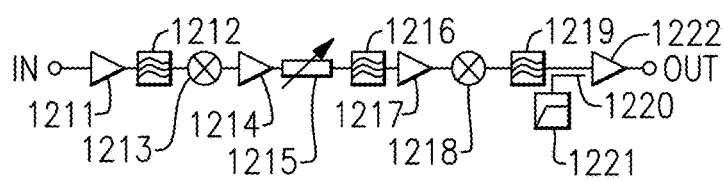
FIG.16B
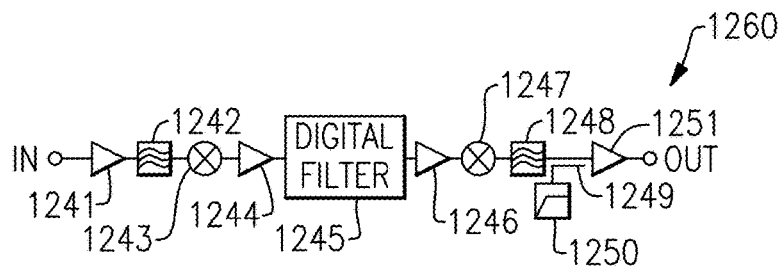
FIG.16C

RADIO FREQUENCY SIGNAL BOOSTERS FOR VEHICLES

REFERENCE TO RELATED CASES

This application is a continuation of application Ser. No. 16/814,717, filed Mar. 10, 2020 and titled "RADIO FREQUENCY SIGNAL BOOSTERS FOR VEHICLES," which is a continuation of application Ser. No. 16/059,465, filed Aug. 9, 2018 and titled "RADIO FREQUENCY SIGNAL BOOSTERS FOR VEHICLES," which claims priority to U.S. Provisional Patent Application No. 62/699,533, filed Jul. 17, 2018 and titled "RADIO FREQUENCY SIGNAL BOOSTERS FOR VEHICLES," and of U.S. Provisional Patent Application No. 62/561,333, filed Sep. 21, 2017 and titled "RADIO FREQUENCY SIGNAL BOOSTERS FOR VEHICLES," and of U.S. Provisional Patent Application No. 62/544,345, filed Aug. 11, 2017 and titled "RADIO FREQUENCY SIGNAL BOOSTERS FOR VEHICLES," each of which is herein incorporated by reference in its entirety. Any and all applications, if any, for which a foreign or domestic priority claim is identified in the Application Data Sheet of the present application are hereby incorporated by reference in their entireties under 37 CFR 1.57.

FIELD

Embodiments of the invention relate to electronic systems and, in particular, to radio frequency (RF) signal boosters for vehicles.

BACKGROUND

A cellular or mobile network can include base stations for communicating with wireless devices located within the network's cells. For example, base stations can transmit signals to wireless devices via a downlink (DL) channel and can receive signals from the wireless devices via an uplink (UL) channel. In the case of a network operating using frequency division duplexing (FDD), the downlink and uplink channels are separated in the frequency domain such that the frequency band operates using a pair of frequency channels.

A wireless device may be unable to communicate with any base stations when located in a portion of the mobile network having poor or weak signal strength. To improve a network's signal strength and/or coverage, a radio frequency (RF) signal booster can be used to amplify signals in the network. For example, the signal booster can be used to amplify or boost signals having frequencies associated with the frequency ranges of the network's uplink and downlink channels.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description of Embodiments" one will understand how the features of this invention provide advantages that include improved communications between base stations and mobile devices in a wireless network.

In one aspect, a vehicle signal booster system is provided. The vehicle signal booster system includes a top unit configured for installation on a roof of a vehicle, the top unit configured to receive a radio frequency (RF) downlink signal from a base station antenna and to provide a boosted RF uplink signal to the base station antenna. The vehicle signal booster system further includes an interior unit configured for installation in a cabin of the vehicle and configured to connect to the top unit by a cable, the interior unit configured to receive an RF uplink signal from a mobile station antenna and to provide a boosted RF downlink signal to the mobile station antenna. The top unit includes a first booster circuit configured to provide amplification to the uplink signal and the downlink signal, and the interior unit comprises a second booster circuit configured to provide amplification to the uplink signal and the downlink signal.

In another aspect, a vehicle signal booster system installed in a vehicle is provided. The vehicle signal booster system includes a top unit on a roof of the vehicle, the top unit configured to receive an RF downlink signal from a base station antenna and to provide a boosted RF uplink signal to the base station antenna. The vehicle signal booster system further includes an interior unit in a cabin of the vehicle and connected to the top unit by a cable, the interior unit configured to receive an RF uplink signal from a mobile station antenna and to provide a boosted RF downlink signal to the mobile station antenna. The top unit includes a first booster circuit configured to provide amplification to the uplink signal and the downlink signal, and the interior unit includes a second booster circuit configured to provide amplification to the uplink signal and the downlink signal.

In another aspect, a method of signal boosting is provided. The method includes receiving an RF downlink signal using a base station antenna on a roof of a vehicle, providing a first amplification to the RF downlink signal using a top unit on the roof of the vehicle, provided the RF downlink signal after the first amplification to an interior unit in a cabin of the vehicle using a cable, providing a second amplification to the RF downlink signal using the interior unit, transmitting the RF downlink signal after the first amplification and the second amplification using a mobile station antenna in the cabin, receiving an RF uplink signal using the mobile station antenna, providing a first amplification to the RF uplink signal using the interior unit, providing the RF uplink signal after the first amplification to the top unit using the cable, providing a second amplification to the RF uplink signal using the top unit, and transmitting the RF uplink signal after the first amplification and the second amplification using the base station antenna.

In another aspect, a vehicle signal booster system is provided. The vehicle signal booster system includes a mobile station antenna configured to receive an RF uplink signal and to transmit a boosted RF downlink signal, the mobile station antenna configured for installation in a cabin of a vehicle. The vehicle signal booster system further includes a base station antenna configured for installation outside the cabin of the vehicle, the base station antenna configured to receive an RF downlink signal and to transmit a boosted RF uplink signal. The vehicle signal booster system further includes a signal booster configured for installation outside the cabin of the vehicle, the signal booster including booster circuitry configured to generate the boosted RF downlink signal based on amplifying one or more downlink channels of the RF downlink signal, and to generate the boosted RF uplink signal based on amplifying one or more uplink channels of the RF uplink signal.

In another aspect, a vehicle signal booster system installed in a vehicle is provided. The vehicle signal booster system includes a mobile station antenna configured to receive an RF uplink signal and to transmit a boosted RF downlink signal, the mobile station antenna in a cabin of a vehicle. The vehicle signal booster system further includes a base station antenna outside the cabin of the vehicle, and configured to receive an RF downlink signal and to transmit a boosted RF uplink signal. The vehicle signal booster system further includes a signal booster outside the cabin of the vehicle, and including booster circuitry configured to generate the boosted RF downlink signal based on amplifying one or more downlink channels of the RF downlink signal, and to generate the boosted RF uplink signal based on amplifying one or more uplink channels of the RF uplink signal.

In another aspect, a method of signal boosting is provided. The method includes receiving an RF uplink signal using a mobile station antenna in a cabin of a vehicle, sending the RF uplink signal to a signal booster outside the cabin using a cable, generating a boosted RF uplink signal based on amplifying one or more uplink channels of the RF uplink signal using the signal booster, transmitting the boosted RF uplink signal using a base station antenna outside the cabin, receiving an RF downlink signal using the base station antenna, generating a boosted RF downlink signal based on amplifying one or more downlink channels of the RF downlink signal using the signal booster, sending the boosted RF downlink signal to the mobile station antenna using the cable, and transmitting the boosted RF downlink signal using the mobile station antenna.

In another aspect, a vehicle signal booster system configured for use in a vehicle is provided. The vehicle signal booster system includes a mobile station antenna configured to receive an RF uplink signal and to transmit a boosted RF downlink signal. The vehicle signal booster system further includes a signal booster including a base station antenna configured to receive an RF downlink signal and to transmit a boosted RF uplink signal, and booster circuitry configured to generate the boosted RF downlink signal based on amplifying one or more downlink channels of the RF downlink signal, and to generate the boosted RF uplink signal based on amplifying one or more uplink channels of the RF uplink signal. The signal booster includes at least one magnet configured to magnetically secure the signal booster to an exterior surface of the vehicle.

In another aspect, a vehicle signal booster system installed in a vehicle is provided. The vehicle signal booster system includes a mobile station antenna in a cabin of the vehicle and configured to receive an RF uplink signal and to transmit a boosted RF downlink signal. The vehicle signal booster system further includes a signal booster outside the cabin. The signal booster includes a base station antenna configured to receive an RF downlink signal and to transmit a boosted RF uplink signal, and booster circuitry configured to generate the boosted RF downlink signal based on amplifying one or more downlink channels of the RF downlink signal, and to generate the boosted RF uplink signal based on amplifying one or more uplink channels of the RF uplink signal. The signal booster includes at least one magnet securing the signal booster to an exterior surface of the vehicle.

In another aspect, a method of signal boosting is provided. The method includes receiving an RF uplink signal using a mobile station antenna in a cabin of a vehicle, using a cable to send the RF uplink signal to a signal booster that is secured to an exterior surface of the vehicle using at least one magnet, generating a boosted RF uplink signal based on amplifying the RF uplink signal using booster circuitry of the signal booster, transmitting the boosted RF uplink signal using a base station antenna of the signal booster, receiving an RF downlink signal using the base station antenna, generating a boosted RF downlink signal based on amplifying the RF downlink signal using the booster circuitry, using the cable to send the boosted RF downlink signal to the mobile station antenna, and transmitting the boosted RF downlink signal using the mobile station antenna.

BRIEF DESCRIPTION OF THE DRAWINGS

FIG. 4A is a front perspective view of one embodiment of a vehicle interior unit including a mobile station antenna.

FIG. 4B is a side view of the vehicle interior unit of FIG. 4A.

FIG. 4C is a front perspective view of another embodiment of a vehicle interior unit including a mobile station antenna.

FIG. 4D is a side view of another embodiment of a vehicle interior unit including a mobile station antenna.

FIG. 4E is a side view of another embodiment of a vehicle interior unit including a mobile station antenna.

FIG. 4F is a plan view of one embodiment of a circuit board for a vehicle interior unit.

FIG. 5 is a perspective view of one example of a shared DC power and RF cable for a vehicle signal booster system.

FIG. 11A is a schematic diagram of another embodiment of booster circuitry.

FIG. 11B is a schematic diagram of another embodiment of booster circuitry.

FIG. 12 is a schematic diagram of one embodiment of an amplification circuit.

FIG. 15A is a schematic diagram of low frequency amplification circuitry according to one embodiment.

FIG. 15B is a schematic diagram of high frequency amplification circuitry according to one embodiment.

FIG. 16A is a schematic diagram of a radio frequency amplification path according to another embodiment.

FIG. 16B is a schematic diagram of a radio frequency amplification path according to another embodiment.

FIG. 16C is a schematic diagram of a radio frequency amplification path according to another embodiment.

DETAILED DESCRIPTION OF EMBODIMENTS

Figure 1A:
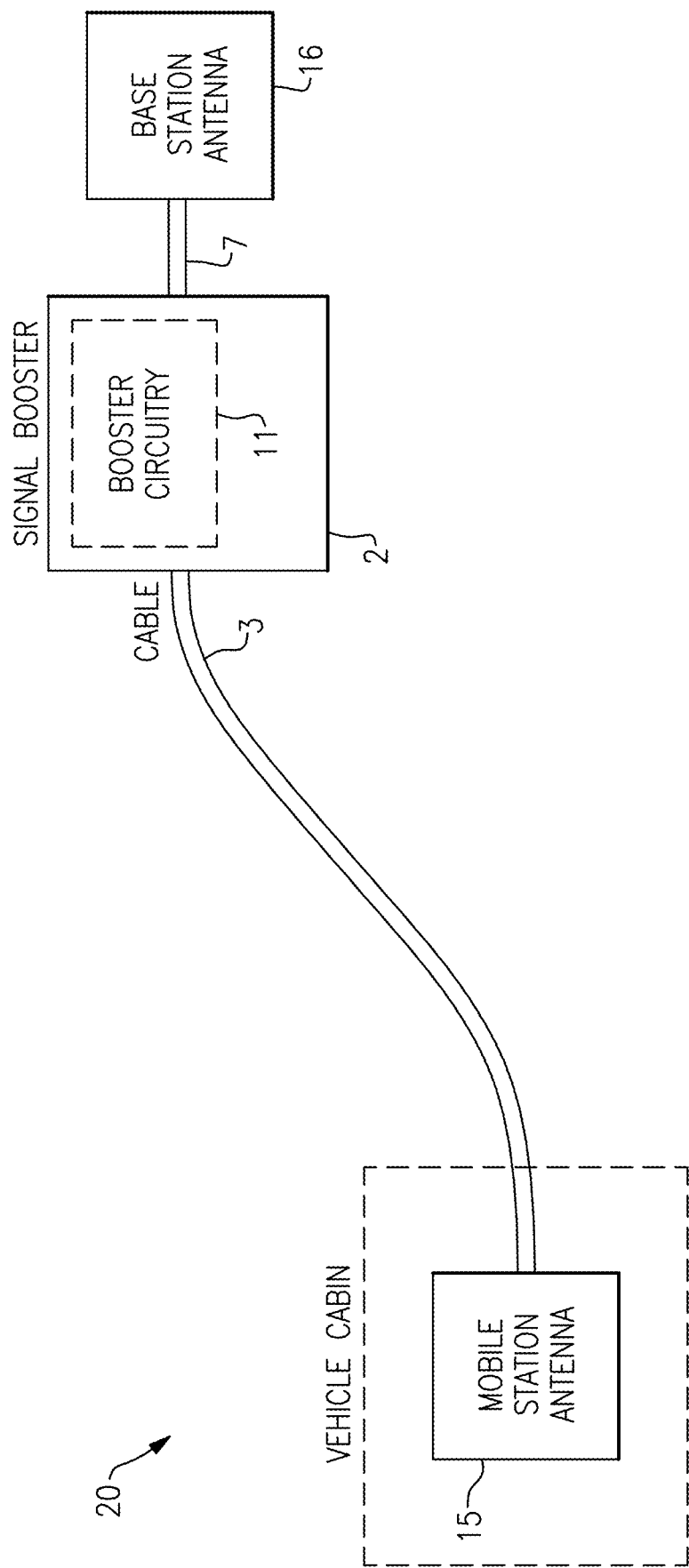
FIG. 1A is a schematic diagram of a vehicle signal booster system according to one embodiment.

Various aspects of the novel systems, apparatus, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatus, and methods disclosed herein, whether implemented independently of, or combined with, any other aspect of the invention. For example, an apparatus can be implemented or a method can be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein can be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Including a signal booster system in a vehicle can advantageously improve both downlink signal strength and uplink signal strength of mobile devices within the vehicle.

For example, the bodies of vehicles (for instance, automobile frames) typically are made of or include metal. Furthermore, even vehicle windows or window membranes can include metal components (for example, impact-resistant membranes, resistive heater elements for defrosting, and/or radio antenna traces). The vehicle body, including a metal frame and window components can have a shielding effect on signals transmitted and received by mobile devices within the vehicle.

The shielding effect of vehicle components can attenuate downlink signals from the base station within the vehicle and/or attenuate uplink signals transmitted from within the vehicle. Under most conditions, the shielding effect can cause signal strength to drop. In one example, the shielding effect reduces signal strength below a threshold for cellular communication, thereby preventing successful voice and/or data communication. In another example, mobile devices operate with higher transmit power to compensate for a loss in signal strength from shielding, and thus operate with greater power consumption and reduced battery life. In yet another example, the mobile device operates with lower signal quality, and thus lower data rate and/or lower voice quality.

Accordingly, including a signal booster system in a vehicle improves signal strength of mobile devices within the vehicle. Furthermore, such a vehicle signal booster system also improves signal-to-noise ratio (SNR) of the mobile devices, thereby permitting mobile devices to transmit at a lower power level to extend battery life. For example, higher SNR can be realized by using superior antennas relative to those used in typical mobile phones, for instance, due to relaxed size and/or power constraints. Furthermore, signal boosters can operate with better receivers and/or transmitters relative to mobile devices.

Various embodiments of signal boosters for vehicles are provided herein.

FIG. 1A is a schematic diagram of a vehicle signal booster system 20 according to one embodiment. The vehicle signal booster system 20 includes a signal booster 2, a cable 3, a mobile station antenna 15, and a base station antenna 16. As shown in FIG. 1A, the signal booster 2 includes booster circuitry 11.

In the illustrated embodiment, the base station antenna 16 is separate from the signal booster 2 and connected via a short cable 7. In certain implementations, the cable 7 between the base station antenna 16 and the signal booster 2 is less than about 20 cm. In yet another embodiment, the cable 7 between the base station antenna 16 and the signal booster 2 provides less than 1 dB of loss at the highest signal frequency of interest. In other embodiments, the cable 7 is omitted.

For example, although the vehicle signal booster system 20 includes a separate base station antenna and signal booster, the teachings herein are also applicable to configurations in which the base station antenna 16 is integrated with the signal booster 2. In one example, the base station antenna 16 can be integrated inside of a housing of the signal booster 2 and/or extend therefrom. In another example, both an integrated base station antenna and external base station antenna are included. In such an implementation, multiple base station antennas can be used for communications or a particular base station antenna can be selected for communications at a given time.

As shown in FIG. 1A, the mobile station antenna 15 is positioned within a cabin of a vehicle (for instance, an automobile), and both the signal booster 2 and the base station antenna 16 are positioned outside of the vehicle cabin. Additionally, the cable 3 serves to connect the mobile station antenna 15 to the signal booster 2.

Implementing the signal booster 2 outside the vehicle cabin can provide a number of advantages relative to a configuration in which the signal booster 2 is inside the vehicle's cabin. For example, a long cable connecting from within the vehicle cabin to a base station antenna has loss that degrades transmit power and/or receiver sensitivity. For instance, on the transmit side the cable loss can be present between an output of a power amplifier (PA) of the signal booster and the base station antenna, and thus can reduce the strength of transmitted signals and correspondingly degrade the range of communication of the signal booster system. Furthermore, on the receive side the cable loss can be present between the base station antenna and an input of a low noise amplifier (LNA) of the signal booster, and thus can reduce the strength of received signals and correspondingly degrade signal-to-noise ratio (SNR) and receiver sensitivity.

In contrast, the illustrated embodiment includes both the signal booster 2 and the base station antenna 16 outside of the vehicle cabin, which allows the components to be placed in close proximity outdoors and thus connected with low loss.

The booster circuitry 11 provides amplification to RF signals associated with one or more uplink and downlink channels. The booster circuitry 11 can include a wide variety of circuitry and/or components. Examples of circuitry and components of the booster circuitry 11 include, but are not limited to, amplifiers (for instance, LNAs, power amplifiers (PAs), variable gain amplifiers (VGAs), programmable gain amplifiers (PGAs), and/or other amplification circuits), filters (for instance, surface acoustic wave (SAW) filters, bulk acoustic wave (BAW) filters, film bulk acoustic resonator (FBAR) filters, active circuit filters, passive circuit filters, and/or other filtering structures), duplexers, circulators, frequency multiplexers (for instance, diplexers, triplexers, or other multiplexing structures), switches, impedance matching circuitry, attenuators (for instance, digital-controlled attenuators such as digital step attenuators (DSAs) and/or analog-controlled attenuators such as voltage variable attenuators (VVAs)), detectors, monitors, couplers, and/or control circuitry.

Figure 1B:
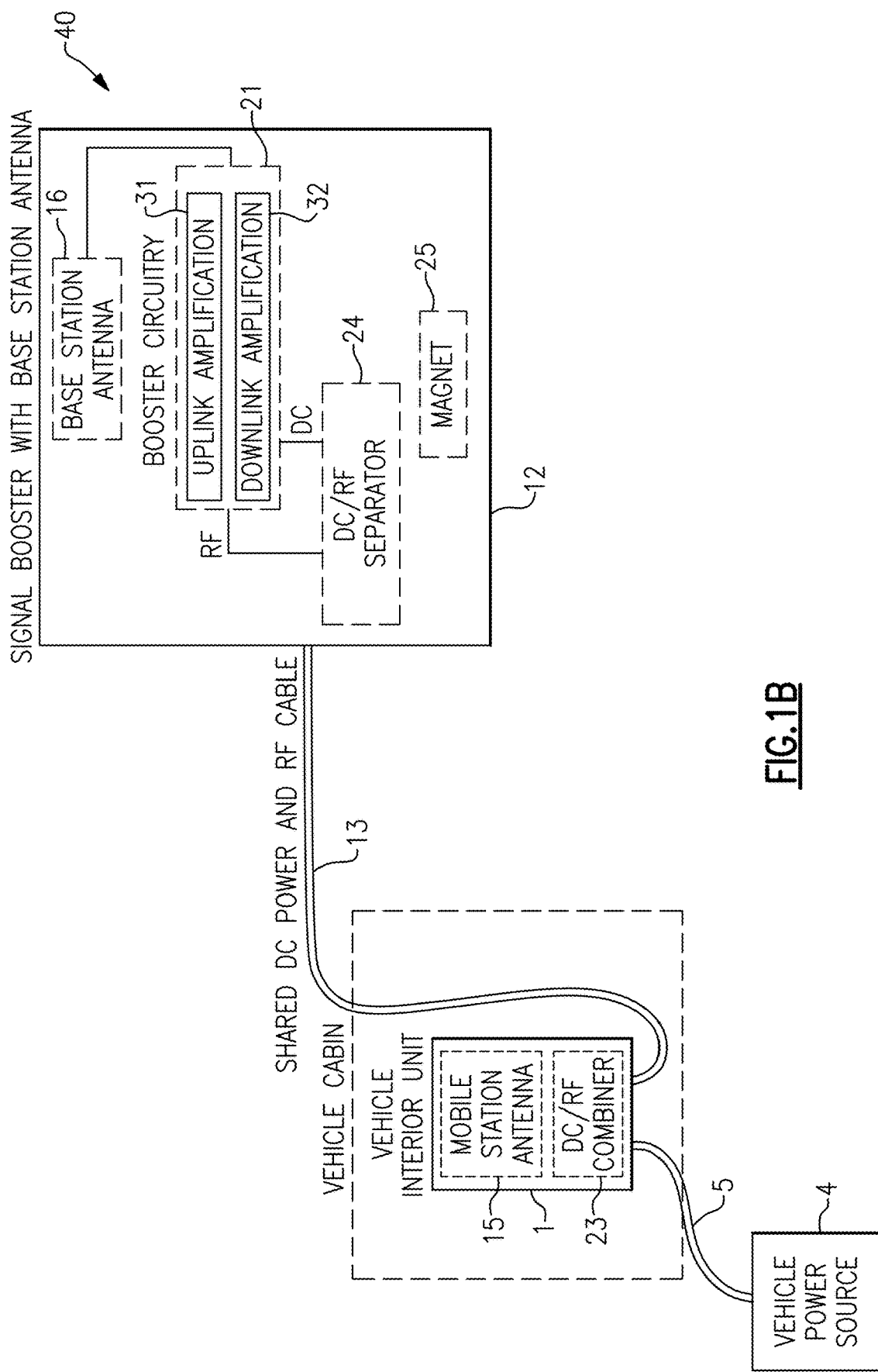
FIG. 1B is a schematic diagram of a vehicle signal booster system according to another embodiment.

FIG. 1B is a schematic diagram of a vehicle signal booster system 40 according to another embodiment. The vehicle signal booster system 40 includes a vehicle interior unit 1, a signal booster 12, a shared DC power and RF cable 13, and a power cable 5. As shown in FIG. 1B, the vehicle interior unit 1 includes a mobile station antenna 15 and a DC/RF combiner 23. A vehicle interior unit is also referred to herein as an interior unit, an interior mount, or a vehicle interior mount. In the illustrated embodiment, the signal booster 12 includes a base station antenna 16, booster circuitry 21, a DC/RF separator 24, and a magnet 25.

The vehicle signal booster system 40 advantageously includes the base station antenna 16 integrated with the signal booster 12. Integrating a base station antenna with a signal booster can improve transmit power and/or enhance receiver sensitivity relative to an implementation in which an external cable is used to connect a signal booster to a base station antenna.

For example, a signal booster can be placed inside the passenger compartment or trunk of the vehicle, and a base station antenna can be placed on a roof of a vehicle. However, in such an implementation, a length of a base station antenna cable can be up to several meters long, resulting in significant cable loss (for example, 7-8 dB or more). Such cable loss can reduce signal-to-noise ratio (SNR), reduce transmit power, reduce receiver sensitivity, affect the quality of communications, reduce a battery life of the mobile devices by requiring a higher transmit power, and/or reduce a number of mobile devices that can be supported by the signal booster system. Furthermore, cable loss is frequency dependent, and thus can become very significant as cellular communication frequencies increase, for instance, in 5G technologies associated with frequencies in the 6 GHz to 100 GHz range.

Accordingly, the illustrated embodiment advantageously integrates the base station antenna 16 with the signal booster 12. In certain configurations, the base station antenna 16 extends from a housing of the signal booster 12. However, other implementations are possible, such as configurations in which the base station antenna 16 is inside of the signal booster's housing.

The signal booster 12 also advantageously includes at least one magnet 25, which is operable to secure the signal booster 12 to an exterior surface of a vehicle. For example, the magnet 25 can be used to securely attach the signal booster 12 to a roof or other magnetic surface of the vehicle. Thus, the signal booster 12 can be conveniently installed in a wide range of locations on a vehicle, and can be removed with little to no damage to the vehicle. Typically the bodies of vehicles (for instance, automobile frames) are made of or include metal to which the magnet 25 can be selectively attached. Thus, the signal booster 12 can be placed on a variety of vehicle surfaces.

Although an embodiment including the magnet 25 is shown, the teachings herein are applicable to vehicle signal boosters that are secured to a vehicle in other ways.

With continuing reference to FIG. 1B, the mobile station antenna 15 is integrated with the vehicle interior unit 1, in this embodiment. In certain configurations, the mobile station antenna 15 is inside a housing of the vehicle interior unit 1. However, other implementations are possible, such as configurations in which the base station antenna 16 extends from the housing of the vehicle interior unit 1, configurations in which the base station antenna 16 is pluggable into the vehicle interior unit 1 or connected to the vehicle interior unit 1 by short cable, or configurations in which the vehicle interior unit is omitted in favor of a standalone mobile station antenna.

The vehicle interior unit 1 can be attached to any suitable location in an interior or cabin of the vehicle. In one example, the vehicle interior unit 1 is attachable to an interior surface of the vehicle, such as a dashboard, console, seat, and/or vent. In another example, the vehicle interior unit 1 is attachable to a bottom of a vehicle roof and radiates signals downward.

Accordingly, the signal booster 12 with base station antenna 16 can be placed external to a vehicle and isolated from the mobile station antenna 15 within the vehicle. The isolation can be provided by the vehicle body. Furthermore, in certain implementations explicit isolation structures can be included in the signal booster 12 and/or vehicle interior unit 1 to further enhance antenna-to-antenna isolation and inhibit unintended oscillation of the signal booster system 40.

In the illustrated embodiment, the vehicle interior unit 1 receives power from a vehicle power source 4 via the power cable 5. In one example, the vehicle interior unit 1 receives DC power, for instance about 12 VDC, from the vehicle power source 4. In certain implementations, one end of the power cable 5 includes a plug, such as a USB smart plug or cigarette lighter plug, which is insertable into a vehicle accessory outlet or socket. Accordingly, in certain implementations, the power cable 5 is pluggable. However, other implementations are possible. For instance, in another example the power cable is implemented as open end twist power wires or other cable that is connectable to a vehicle battery or other vehicle power source.

The vehicle interior unit 1 includes the DC/RF combiner 23, which provides a DC supply voltage to the signal booster 12 via the shared DC power and RF cable 13, in this embodiment. For example, the DC/RF combiner 23 can include circuitry for combining a DC power supply and an RF signal, while providing isolation. Thus, the vehicle interior unit 1 can combine a DC supply voltage from the vehicle power source 4 with RF signals associated with communications of the mobile station antenna 15. The RF signals include RF signals transmitted by the mobile station antenna 15 and RF signals received by the mobile station antenna 15. Accordingly, the shared DC power and RF cable 13 can operate bi-directionally with respect to RF signaling.

In certain implementations, the shared DC power and RF cable 13 includes a conductor that carries an RF voltage that is superimposed on a DC supply voltage. Implementing a vehicle signal booster system with a shared DC power and RF cable can provide a number of advantages, such as reduced cabling cost, reduced connectors/connections, improved reliability, and/or enhanced integration. However, other implementations are possible. For example, in another embodiment, a separate power cable is provided directly to the signal booster 12. In yet another embodiment, separate power and RF cables are bundled as a complex cable, which is also referred to herein as a composite cable.

The signal booster 12 of FIG. 1B includes the DC/RF separator 24. The DC/RF separator 24 can provide separation or extraction of a DC supply voltage from the shared DC power and RF cable 13, and use the DC supply voltage to power the booster circuitry 21. Additionally, the DC/RF separator 24 also facilitates transmission and reception of RF signals by the signal booster 12 over the cable 13.

In certain implementations, the DC/RF separator 24 includes isolation circuitry (for instance, filters and/or other isolators) for isolating RF circuitry used for signal boosting from DC supply noise.

Although the signal booster 12 is illustrated as including the DC/RF separator 24, in certain embodiments the DC/RF separator 24 is omitted. For example, the DC/RF separator 24 can be omitted in implementations in which DC power is provided to the signal booster 12 separately from RF signals.

In the illustrated embodiment, the booster circuitry 21 receives RF uplink signals received from the mobile station antenna 15 via the shared DC power and RF cable 13. The RF uplink signals are amplified by an uplink amplification circuit 31 of the booster circuitry 21, and subsequently transmitted on the base station antenna 16. The base station antenna 16 also receives RF downlink signals, which are amplified by a downlink amplification circuit 32 of the booster circuitry 21, and subsequently transmitted to the mobile station antenna 15 via the shared DC power and RF cable 13.

The booster circuitry 21 can include a wide variety of circuitry and/or components. Examples of circuitry and components of the booster circuitry 21 can be as described above with respect to the booster circuitry 11 of FIG. 1A.

In certain implementations, the booster circuitry 21 and/or the DC/RF separator 24 are included on one or more circuit boards enclosed within the housing of the signal booster 12.

In certain configurations, the vehicle signal booster system 40 is operable to charge a battery of a user's mobile device. In one example, a charging cable is provided from the vehicle interior unit 1 for charging the mobile device. In another example, a mobile device can be coupled to the vehicle interior unit 1 and charged via wireless charging.

Figure 1C:
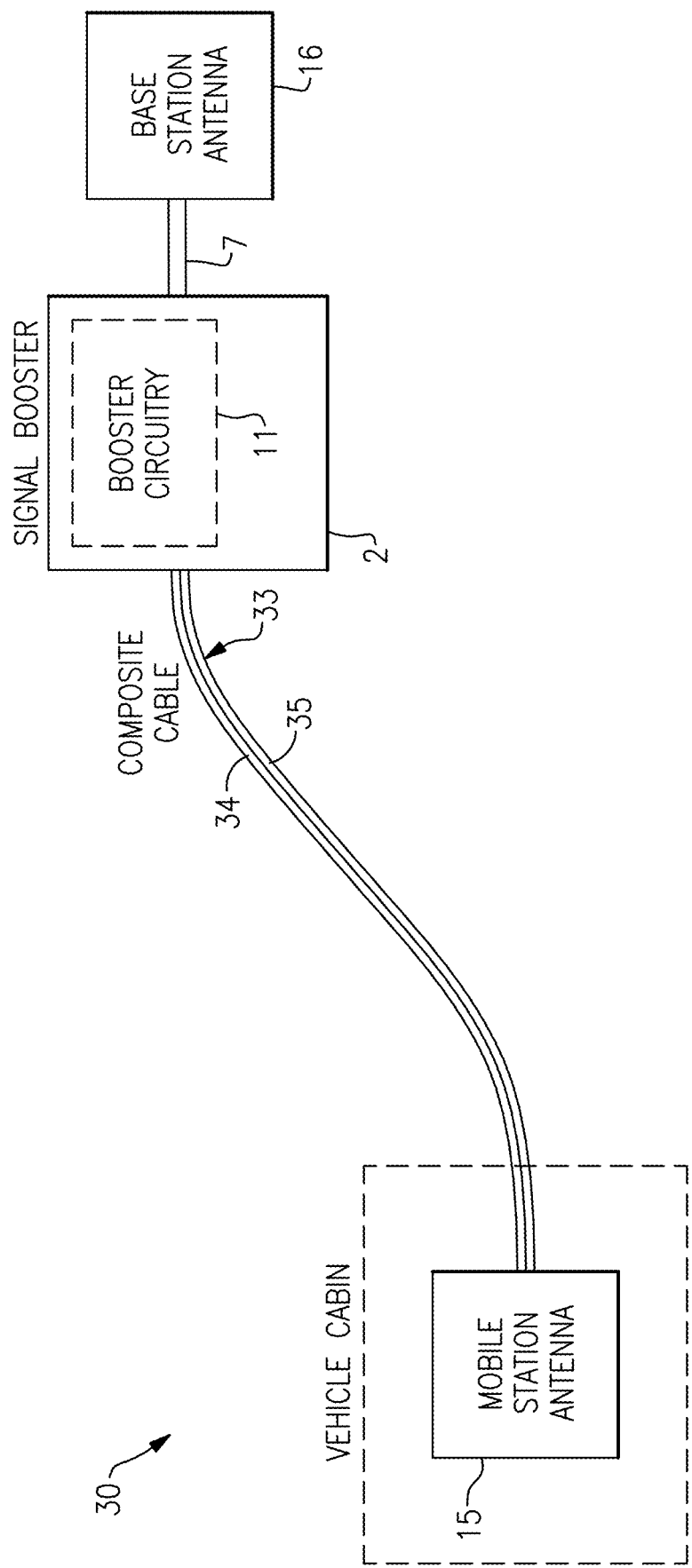
FIG. 1C is a schematic diagram of a vehicle signal booster system according to another embodiment.

FIG. 1C is a schematic diagram of a vehicle signal booster system 30 according to another embodiment. The vehicle signal booster system 30 of FIG. 1C is similar to the vehicle signal booster system 10 of FIG. 1A, except that the vehicle signal booster system 30 includes a complex or composite cable 33. The composite cable 33 includes a power cord 34 that carries DC power and an RF line 35 that carriers RF signals. As shown in FIG. 1C, the power cord 34 and the RF line 35 are bundled together, for instance, in a common exterior insulator or casing.

Figure 2:
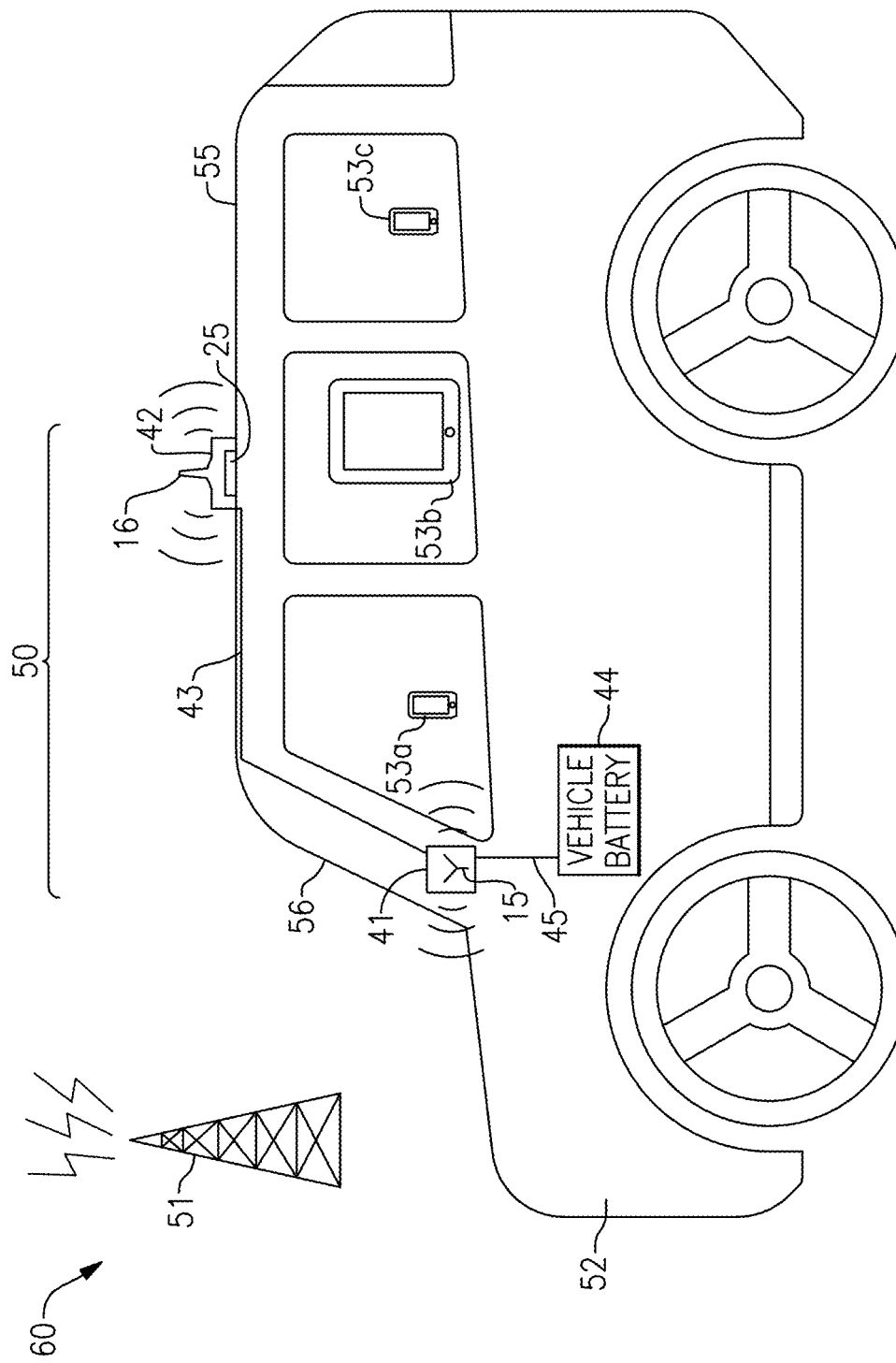
FIG. 2 is a schematic diagram of a mobile network according to one embodiment.

FIG. 2 is a schematic diagram of a mobile network 60 according to one embodiment. The mobile network 60 includes a vehicle signal booster system 50, a base station 51, and mobile devices 53a-53c (three shown, in this example). The vehicle signal booster system 50 includes a vehicle interior unit 41, a signal booster 42, a power and RF cable 43, and a power cable 45. For clarity of the figures, only a portion of the internal circuitry and components of the vehicle interior unit 41 and the signal booster 42 are shown in FIG. 2.

The vehicle signal booster system 50 is implemented in accordance with one or more of the features as described herein. For example, the vehicle interior unit 41, the signal booster 42, the power and RF cable 43, and/or the power cable 45 can include one or more features described above with respect to the vehicle signal booster systems of FIGS. 1A-1C.

In the illustrated embodiment, the signal booster 42 including the integrated base station antenna 16 is mounted on a roof 55 of a vehicle 52. The signal booster 42 can be attached to the roof 55 via at least one magnet 25 of the signal booster 42, in this embodiment. Although FIG. 2 illustrates an example in which the signal booster 42 is attached to a top of the roof 55 via the magnet 25, the teachings are applicable to configurations in which a signal booster is attached to other surfaces of a vehicle and/or via other types of attachment.

The illustrated base station antenna 16 is subject to shielding effects from metal and/or other components of the roof 55, which provides enhanced antenna-to-antenna isolation. In certain implementations, the base station antenna 16 is an omnidirectional antenna operable to transmit and receive signals a full 360 degrees around a perimeter of a vehicle such that the base station antenna 16 radiates primarily in the horizontal plane in which the vehicle 52 moves.

Accordingly, the illustrated embodiment achieves the advantages of robust communication between the base station 51 and the base station antenna 16 while also achieving robust isolation between the base station antenna 16 and the mobile station antenna 15 via shielding effects of the vehicle 52.

In certain implementations herein, metal components of a vehicle are advantageously used to provide shielding or isolation between a base station antenna and a mobile station antenna. For example, a vehicle's roof can serve as a perfect or near perfect reflector or isolator for providing antenna-to-antenna isolation, for instance, 40 dB or more. In certain implementations, shielding in the range of 40 to 50 dB is sufficient antenna-to-antenna isolation for a signal booster operating in a car. For example, currently maximum gain for a mobile booster is 50 dB, as specified by FCC regulation. In certain implementations, the signal booster 42 and/or vehicle interior unit 41 can further include an explicit isolator configured to provide isolation between the base station antenna 16 and the mobile station antenna 15, thereby providing isolation beyond that provided by the vehicle's body.

The vehicle interior unit 41 including the mobile station antenna 15 is remote from the signal booster 42 and can be mounted in a wide variety of ways, for example, on a dashboard adjacent to a front windshield 56 as shown in FIG. 2. However, the vehicle interior unit 41 can be mounted elsewhere in or around the cabin of the vehicle 52. In another embodiment, the vehicle interior unit 41 can be omitted in favor of a mobile station antenna that is not integrated with a vehicle interior unit. For example, the vehicle interior unit can be omitted altogether or the mobile station antenna 15 can be separated from the mount 41 by space to provide distance for wirelessly communicating with a mobile device secured to the mount.

In certain implementations, the mobile station antenna 15 is an omnidirectional or directional antenna configured to primarily radiate within the vehicle's cabin (including the passenger and driver compartments) of the vehicle 52. Thus, the mobile station antenna 15 can communicate with mobile devices of any occupants.

As shown in FIG. 2, the vehicle interior unit 41 receives power from a vehicle battery 44 over a power cable 45. Additionally, the power and RF cable 43 is used both for communicating RF signals between the mobile station antenna 15 and the signal booster 42 and for supplying the signal booster 42 with power.

The signal booster system 50 can be implemented using any suitable combination of features disclosed herein.

Although the mobile network 60 illustrates an example with three mobile devices and one base station, the mobile network 60 can include base stations and/or mobile devices of other numbers and/or types. For instance, mobile devices can include mobile phones, tablets, laptops, wearable electronics (for instance, smart watches), and/or other types of user equipment (UE) suitable for use in a wireless communication network.

Although an example with an automobile is shown, a vehicle signal booster system can be included in a variety of types of vehicles, such as land vehicles, watercraft, or aircraft. As used herein, land vehicles include not only road vehicles, such as cars, trucks, sport utility vehicles (SUVs), vans and buses, but also other types of vehicles that operate on land, such as trains.

The signal booster 42 can retransmit signals to and receive signals from the base station 51 using the base station antenna 16, and can retransmit signals to and receive signals from the mobile devices 53*a*-53*c* using the mobile station antenna 15. For example, the base station antenna 16 can retransmit signals to the base station 51 over one or more uplink channels, and can receive signals from the base station 51 over one or more downlink channels. Additionally, the mobile station antenna 15 can retransmit signals to the mobile devices 53*a*-53*c* over one or more downlink channels, and can receive signals from the devices over one or more uplink channels.

The signal booster 42 can be used to communicate in a variety of types of networks, including, but not limited to, networks operating using FDD, TDD, or a combination thereof.

As the vehicle 52 moves and/or as a network environment changes, the base station antenna 16 can communicate with different base stations. Thus, it will be understood that base station 51 represents a particular base station or group of base stations that the signal booster system 50 is in communication with at a particular time.

Thus, although FIG. 2 illustrates the signal booster system 50 as communicating with one base station 51, the signal booster system 50 can communicate with multiple base stations. For example, the signal booster system 50 can be used to communicate with base stations associated with different cells of a network and/or with base stations associated with different networks, such as networks associated with different wireless carriers and/or frequency bands.

In certain implementations, the mobile devices 53*a*-53*c* can communicate at least in part over multiple frequency bands, including one or more cellular bands such as, Band II, Band IV, Band V, Band XII, and/or Band XIII. For instance, in one example, the first mobile device 53*a* can operate using Advanced Wireless Services (AWS) (Band IV), the second mobile device 53*b* can operate using Personal Communication Services (PCS) (Band II), and the third mobile device 53*c* can operate using Cellular services (Band V). Furthermore, in certain configurations, all or a subset of the mobile devices 53*a*-53*c* can communicate using Long Term Evolution (LTE), and may transmit and receive Band XII signals, Band XIII signals, and/or other signals associated with LTE. The teachings herein are also applicable to communications using carrier aggregation, including those associated with 4.5G, 5G technologies, and other emerging mobile communication technologies.

Although specific examples of frequency bands and communication technologies have been described above, the teachings herein are applicable to a wide range of frequency bands and communications standards. For example, signal boosters can be used to boost a wide variety of bands, including, but not limited to, 2G bands, 3G bands (including 3.5G bands), 4G bands (including 4.5G bands), 5G bands, Wi-Fi bands (for example, according to Institute of Electrical and Electronics Engineers 802.11 wireless communication standards), and/or digital television bands (for example, according to Digital Video Broadcasting, Advanced Television System Committee, Integrated Services Digital Broadcasting, Digital Terrestrial Multimedia Broadcasting, and Digital Multimedia Broadcasting standards).

Accordingly, the signal booster system 50 can be configured to boost signals associated with multiple frequency bands so as to improve network reception for each of the mobile devices 53*a*-53*c*. Configuring the signal booster system 50 to service multiple frequency bands can improve network signal strength and/or overcome loss arising from a vehicle body, which can be made of or include metal. For example, the signal booster system 50 can improve network signal strength of devices using the same or different frequency bands, the same or different wireless carriers, and/or the same or different wireless technologies. Configuring the signal booster system 50 as a multi-band booster can avoid the cost of separate signal boosters for each specific frequency band and/or wireless carrier.

Figure 3A:
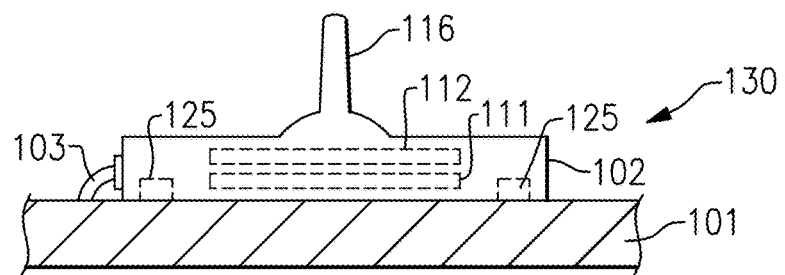
FIG. 3A is a side view of one embodiment of a signal booster.
Figure 3B:
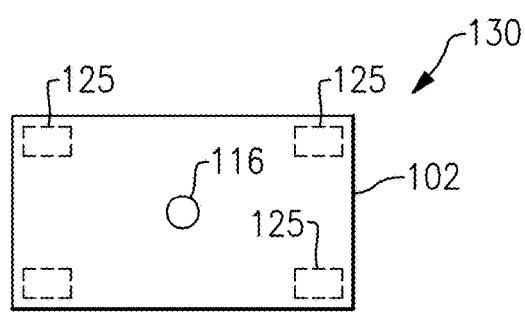
FIG. 3B is a plan view of the signal booster of FIG. 3A.

FIG. 3A is a side view of one embodiment of a signal booster 130. FIG. 3B is a plan view of the signal booster 130 of FIG. 3A. The signal booster 130 includes a housing 102, a circuit board 111, an isolator 112, a base station antenna 116, and magnets 125. As shown in FIG. 3A, the signal booster 130 is secured against a vehicle surface 101 via the magnets 125, and is connected to a cable 103.

The circuit board 111 includes circuitry and electronic components of the signal booster 130, such as booster circuitry and DC/RF separator circuitry. In the illustrated embodiment, the base station antenna 116 extends from the housing 102 of the signal booster 130. However, other implementations are possible, such as configurations in which a base station antenna is within the housing 102. Although one implementation of a base station antenna is shown, other implementations of base station antennas can be used in accordance with the teachings herein. Furthermore, multiple base station antennas can be included.

In the illustrated embodiment, the base station antenna 116 is substantially perpendicular to the circuit board 111, and isolated from the circuit board 111 by the isolator or RF shield 112. Implementing a signal booster in this manner provides robust base station communications (for instance, a full 360 degrees around a perimeter of a vehicle) and excellent shielding to the base station antenna 116. In certain implementations, the RF shield 112 can include an enclosure (for instance, a lid) covering at least a portion of the circuit board 111.

The magnets 125 magnetically secure the signal booster 130 against the vehicle surface 101. Thus, the signal booster 130 can be conveniently installed in a wide range of vehicle surfaces, and can be removed with little to no damage to the vehicle. Although one example of a magnet configuration is shown, other implementations are possible, such as configurations using more or fewer magnets, magnets of different shapes, magnets of different sizes, and/or different placements of magnets. In another embodiment, one or more magnets are attached to an outer surface of the housing 102. In yet another embodiment, a signal booster is attached to a vehicle without magnets.

In certain embodiments, the signal booster 130 further includes at least one heat sink and/or fan for providing cooling.

The housing 102 is used to house the circuitry of the signal booster 130. In certain implementations, the housing includes a UV resistant coating or film for heat reduction and/or a seal coating or film for moisture, humidity, and/or corrosion protection. Although the housing 102 is illustrated as box-shaped (for instance, a rectangular prism) in FIGS. 3A-3B, the housing can have other shapes and/or sizes. The housing 102 can be made of a wide variety of materials, including, but not limited to, plastic and/or a metal, such as stainless steel.

In the illustrated embodiment, the signal booster 130 is connected to the cable 103. In one example, the cable 103 is a shared DC power and RF cable used for carrying RF and DC power. In another example, the cable 103 is a complex cable bundling an RF cable and a power cable. In yet another example, the signal booster 130 is connected to multiple cables, such as an RF cable and a separate power cable.

The cable 103 can be provided to an interior of a vehicle in a variety of ways, such as via a gap in a window or door frame. For example, the cable 103 can be implemented to be sufficiently thin to pass through a gap between a frame and a door of the vehicle even when the door is closed.

In certain implementations, a first end of the cable 103 connects to a mobile station antenna port of the signal booster 130. In certain implementations, a second end of the cable 103 connects to a mobile station antenna and/or a port of a vehicle interior unit.

Figure 3C:
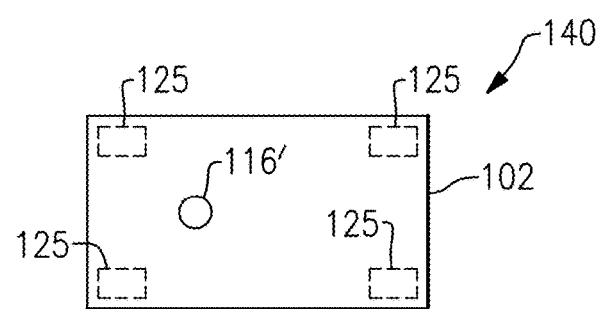
FIG. 3C is a plan view of another embodiment of a signal booster.

FIG. 3C is a plan view of another embodiment of a signal booster 140. The signal booster 140 of FIG. 3C is similar to the signal booster 130 of FIGS. 3A-3B, except that the signal booster 140 of FIG. 3C includes a base station antenna 116' that is offset from a center of the housing 102. In certain implementations, offsetting the base station antenna 116' in this manner can provide superior RF isolation between the base station antenna 116' and circuitry within the housing 102.

FIG. 4A is a front perspective view of one embodiment of a vehicle interior unit 210. FIG. 4B is a side view of the vehicle interior unit 210 of FIG. 4A. The vehicle interior unit 210 illustrates one embodiment of the vehicle interior unit of FIGS. 1A-2. However, other implementations of vehicle interior units are possible.

The vehicle interior unit 210 includes a housing 201 including a mobile station antenna 202 and a magnet 203 therein. The vehicle interior unit 210 further includes ventilation grips 204 extending from the housing 201. The vehicle interior unit 210 is connected to a shared DC power and RF cable 208 and a power cable 205.

In certain implementations, the housing 201 includes plastic and/or a rubber suitable for securely holding a mobile device. Additionally, the magnet 203 provides a magnetic field that attracts a magnetic material attached to (for instance, adhered to) or embedded in a mobile device, thereby allowing a user to securely suspend the mobile device to the vehicle interior unit 210 for display and/or use hands free.

In certain configurations, the mobile station antenna 202 communicates with a mobile device that is suspended to the vehicle interior unit 210 using near-field communications, which can also be referred to herein as touched communications or direct coupling communications.

In one embodiment, the vehicle interior unit 210 also includes a wireless charging circuit. For example, a mobile device can be coupled to the vehicle interior unit 210 and charged via wireless charging. In certain implementations, the mobile station antenna 202 is implemented on a circuit board that also includes the wireless charging circuit. However, the wireless charging circuit can be located in other places.

With continuing reference to FIGS. 4A-4B, ventilation grip 204 is used to secure the vehicle interior unit 210 to a vehicle's air vent or ventilation grate. However, a vehicle interior unit can be mounted or secured in other ways. In one embodiment, a vehicle interior unit includes multiple user-selectable fasteners (for instance, a ventilation grip, a suction cup, and/or other fasteners) which are attachable and detachable from the vehicle interior unit to permit a user to select a desired type of fastener.

The mobile station antenna 202 is used to communicate with mobile devices in a passenger compartment of a vehicle. Furthermore, when a mobile device is attached to the vehicle interior unit 210 via the magnet 203, a communication distance is relatively small, which in turn can lead to lower interference, higher signal integrity, and/or reduced transmit power. Although one implementation of a mobile station antenna is shown, other implementations of mobile station antennas can be used in accordance with the teachings herein. Furthermore, multiple mobile station antennas can be included, such as mobile station antennas of different types.

The power cable 205 includes a plug 206 for insertion in a vehicle power source. The plug 206 corresponds to a cigarette lighter plug, in this example. The power cable 205 provides power to the vehicle interior unit 210 in implementations in which the vehicle interior unit 210 includes externally powered circuitry. The vehicle interior unit 210 provides a DC supply voltage to the shared DC power and RF cable 208, which is used to power a signal booster. RF signals transmitted and received by the mobile station antenna 202 are also provided over the shared DC power and RF cable 208, in this embodiment.

FIG. 4C is a front perspective view of another embodiment of a vehicle interior unit 220. The vehicle interior unit 220 of FIG. 4C is similar to the vehicle interior unit 210 of FIGS. 4A-4B, except that the vehicle interior unit 220 further includes a circuit board 211 and RF shield 212 in the housing 201, and includes a port that receives an insertable adapter 213.

The insertable adapter 213 can correspond to a wide variety of adapters, such as a cellular modem (for instance, a 3G/4G modem), a Wi-Fi dongle, an insertable antenna, etc.

The port can be implemented in a variety of ways, for instance via USB or another interface. With a cellular modem or Wi-Fi dongle, a cellular signal can be boosted first then transformed into Wi-Fi, through air or conducted. Accordingly, both cellular and Wi-Fi signal service can then be provided over the air at the same time to occupants of the vehicle.

Implementing the vehicle interior unit 220 to include a port for receiving an adapter provides a number of advantages. In one example, a cellular modem can be provided for providing mobile devices in the vehicle with Wi-Fi access. In another example, an antenna can be attached to provide robust communication with one or more mobile devices, for instance, when a mobile device is attached to the mount via the magnet 203. In certain implementations, the port can additionally or alternatively be used for inserting a cable used for charging a battery of a mobile device.

In the illustrated embodiment, the circuit board 211 includes a router 217, such as a Wi-Fi router. The router 217 is connected to insertable adapter 213 via the port, in this example. In another example, rather than using an insertable adapter 213, circuitry of the adapter (for instance, a cellular modem) can be integrated with or within the vehicle interior unit 220.

The circuit board 211 also includes a power management circuit 218, which can be used to regulate, filter, isolate, and/or otherwise manage power received from the power cable 205 to generate a DC supply voltage for the shared DC power and RF cable 208. The power management circuit 218 can also include DC/RF combiner circuitry for combining RF and DC while providing isolation. For example, the power management circuit 218 can be used to superimpose an RF signal onto the DC supply voltage.

In the illustrated embodiment, the RF shield 212 is interposed between the mobile station antenna 202 and the circuit board 211. The RF shield 212 can provide a number of advantages, such as helping to prevent operation of the circuit board 211 from interfering with RF communications of the mobile station antenna 202.

In one embodiment, a vehicle interior unit includes a width and a length of less than 15 cm and a thickness of less than 5 cm. However, other dimensions are possible.

FIG. 4D is a side view of another embodiment of a vehicle interior unit 230 including a mobile station antenna 202. The vehicle interior unit 230 of FIG. 4D is similar to the vehicle interior unit 210 of FIGS. 4A and 4B, except that the vehicle interior unit 230 illustrates an implementation in which the mobile station antenna 202 is positioned between the magnet 203 and the ventilation grips 204.

FIG. 4E is a side view of another embodiment of a vehicle interior unit 240 including a mobile station antenna 202. The vehicle interior unit 240 of FIG. 4E is similar to the vehicle interior unit 210 of FIGS. 4A and 4B, except that the vehicle interior unit 240 illustrates an implementation in which the mobile station antenna 202 includes a hole in which the magnet 203 is positioned. Implementing the vehicle interior unit 240 in this manner aids in securing a mobile device to the mount via magnetization while maintaining a robust wireless communication link with the mobile device. The vehicle interior unit 240 further includes fasteners 231 for securing the mobile station antenna 202 to the housing 201.

FIG. 4F is a plan view of one embodiment of a circuit board 260 for a vehicle interior unit. The circuit board 260 includes a patterned conductor 252 that is formed on a non-conductive layer 251. The patterned conductor 252 serves as a mobile station antenna. The circuit board 260 further includes a combining and isolation circuit 253, which serves to combine RF and DC for transmission over a shared DC power and RF cable.

Although various examples of vehicle interior units and structures therein have been discussed above with reference to FIGS. 4A-4F, other implementations are possible. In various embodiments, one or more visual indicators (for instance, a light and/or display) are included on the mount.

FIG. 5 is a perspective view of one example of a shared DC power and RF cable 310 for a vehicle signal booster system. In this example, the shared DC power and RF cable 310 is implemented as a coaxial cable including outside insulation 301, metal mesh conductor 302, interior insulation 303, and metal inner conductor 304.

The outside insulation 301 protects the coaxial cable from external friction, interference, or damage. The metal mesh conductor 302 aids in containing signal leakage from metal inner conductor 304 and also shields the signal transmitted on the metal inner conductor 304 from external electric and/or magnetic fields while serving as ground.

In the illustrated embodiment, the metal mesh conductor 302 carries a ground voltage to a signal booster, and the metal inner conductor 304 carries an RF voltage superimposed on a DC supply voltage. Thus, a common conductor carries both DC power and RF signals, in this embodiment.

The shared DC power and RF cable 310 illustrates one embodiment of a shared DC power and RF cable that can be used for carrying both RF signals and DC supply voltage to a signal booster. In another embodiment, a pair of separate cables are physically bundled together (referred to herein as a complex cable) to carry RF and DC power, respectively. However, the teachings herein are application to other implementations of shared DC power and RF cables, as well as to signal booster systems that do not include a shared DC power and RF cable.

Figure 6B:
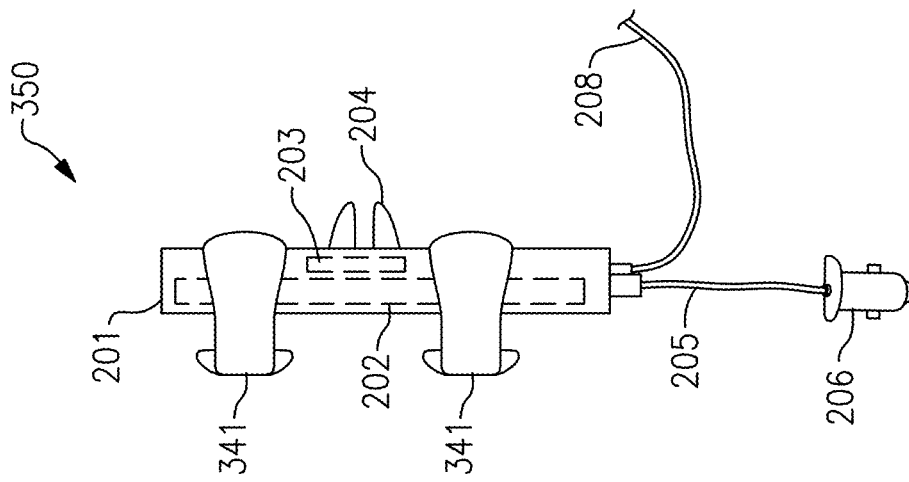
FIG. 6B is a side view of the vehicle interior unit of FIG. 6A.
Figure 6A:
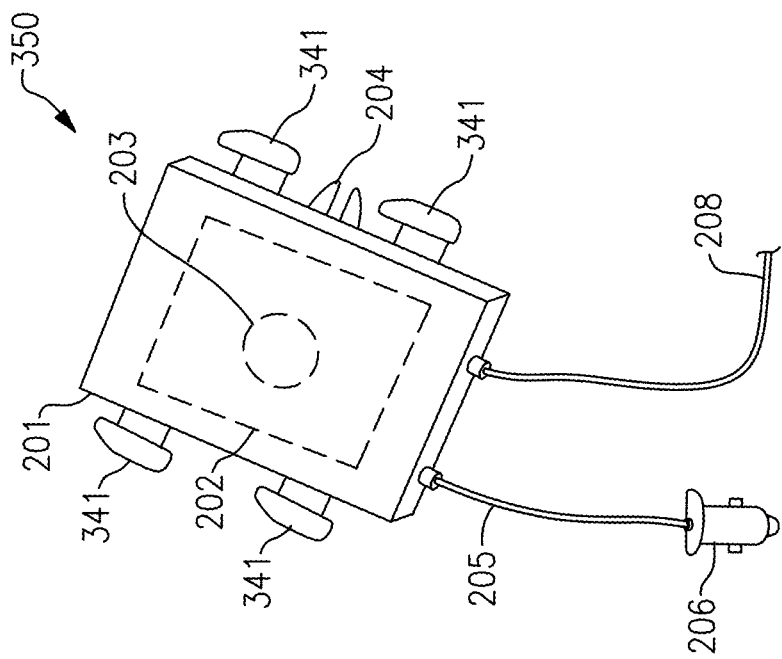
FIG. 6A is a front perspective view of another embodiment of a vehicle interior unit including a mobile station antenna.

FIG. 6A is a front perspective view of another embodiment of a vehicle interior unit 350 including a mobile station antenna. FIG. 6B is a side view of the vehicle interior unit 350 of FIG. 6A.

The vehicle interior unit 350 of FIGS. 6A-6B is similar to the vehicle interior unit 210 of FIGS. 4A-4B, except that the vehicle interior unit 350 further includes mobile device clamps 341 to aid in further securing a mobile device to the vehicle interior unit 350 when desired or as an alternative to magnetic mounting.

Figure 7A:
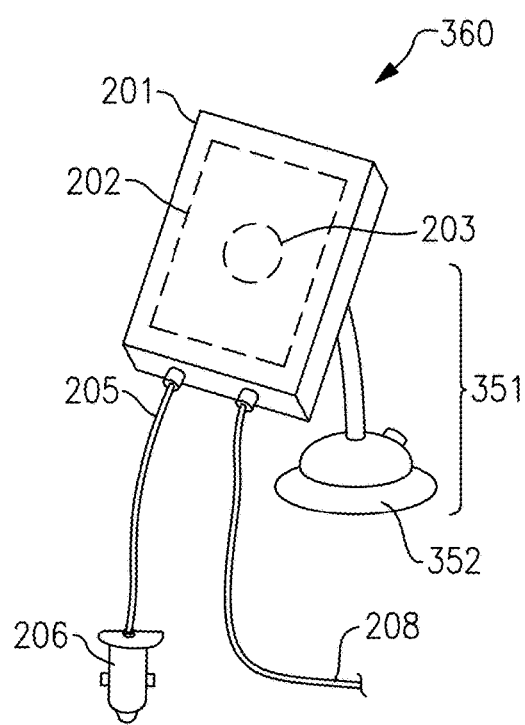
FIG. 7A is a front perspective view of another embodiment of a vehicle interior unit including a mobile station antenna.
Figure 7B:
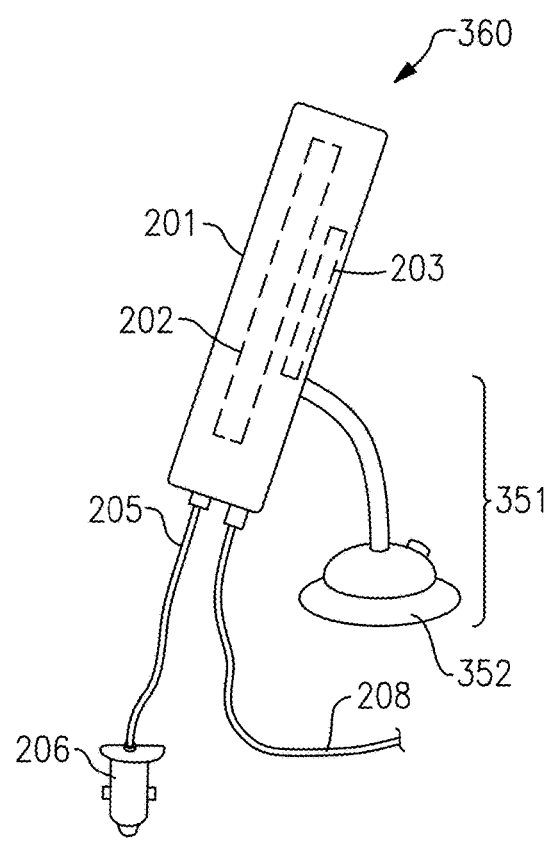
FIG. 7B is a side view of the vehicle interior unit of FIG. 7A.

FIG. 7A is a front perspective view of another embodiment of a vehicle interior unit 360 including a mobile station antenna. FIG. 7B is a side view of the vehicle interior unit 360 of FIG. 7A.

The vehicle interior unit 360 of FIGS. 7A-7B is similar to the vehicle interior unit 210 of FIGS. 4A-4B, except that the vehicle interior unit 360 omits the ventilation grips 204 in favor of including suction cup stand 351 for securing the vehicle interior unit 360 to a suitable interior surface of a vehicle, such as a dashboard, interior window surface, or console.

In certain implementations, the power cable 205 and/or the shared DC power and RF cable 208 connect to the vehicle interior unit 360 via a base 352 of the suction cup stand 351. Thus, cables can connect to a vehicle interior unit in a wide variety of ways. Furthermore, in certain implementations, one or more cables bypass the vehicle interior unit and go directly to a signal booster.

Figure 8:
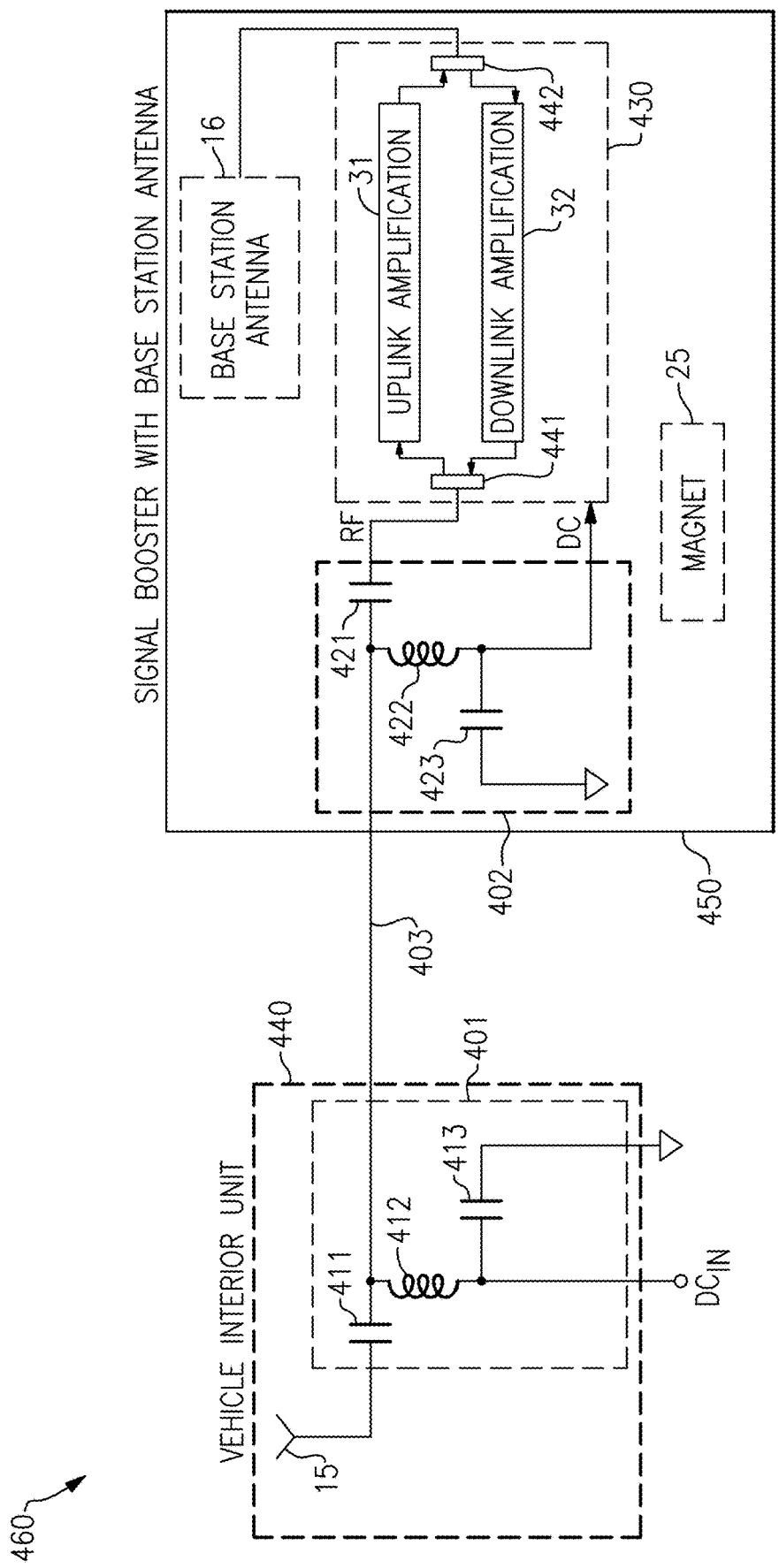
FIG. 8 is a schematic diagram of a vehicle signal booster system including circuitry for connecting to a shared DC power and RF cable, according to another embodiment.

FIG. 8 is a schematic diagram of a vehicle signal booster system 460 including circuitry for connecting to a shared DC power and RF cable, according to another embodiment. As shown in FIG. 8, the vehicle signal booster system 460 includes a shared DC power and RF cable 403, a vehicle interior unit 440, and a signal booster 450.

The vehicle interior unit 440 of FIG. 8 is similar to the vehicle interior unit 1 of FIG. 1B, except that the vehicle interior unit 440 includes an isolator/combiner circuit 401, which corresponds to one embodiment of the DC/RF combiner 23 of FIG. 1B. The isolator combiner circuit 401 includes a DC blocking capacitor 411, an RF choke inductor 412, and a decoupling capacitor 413. The isolator/combiner circuit 401 serves to combine a DC input voltage $DC_{IN}$ with an RF signal associated with the mobile station antenna 15 while providing isolation.

The signal booster 450 of FIG. 8 is similar to the signal booster 12 of FIG. 1B, except that the signal booster 450 includes an isolator/separator circuit 402, which corresponds to one embodiment of the DC/RF separator 24 of FIG. 1B. The isolator/separator circuit 402 includes a DC blocking capacitor 421, an RF choke inductor 422, and a decoupling capacitor 423.

The signal booster 450 of FIG. 8 also includes booster circuitry 430, which corresponds to one implementation of the booster circuitry 21 of FIG. 1B. The booster circuitry 430 includes a first splitting/combining structure 441, which can include one or more multiplexers, one or more diplexers, and/or other suitable components for splitting/separating and combining RF signals. The booster circuit 430 further includes a second splitting/combining structure 442, an uplink amplification circuit 31, and a downlink amplification circuit 32. The isolator/separator circuit 402 provides DC power to the signal booster 450.

As shown in FIG. 8, the first splitting/combining structure 441 includes a first terminal electrically connected to an input terminal of the uplink amplification circuit 31, a second terminal electrically connected to an output terminal of the downlink amplification circuit 32, and an antenna terminal electrically connected to the mobile station antenna 15 by way of the isolator/separator circuit 402, the shared DC power and RF cable 403, and the isolator/combiner circuit 401. Additionally, the second splitting/combining structure 442 includes a first terminal electrically connected to an output terminal of the uplink amplification circuit 31, a second terminal electrically connected to an input terminal of the downlink amplification circuit 32, and an antenna terminal electrically connected to the base station antenna 16.

With continuing reference to FIG. 8, the shared DC power and RF cable 403 carries an RF voltage superimposed on a DC supply voltage. Thus, the shared DC power and RF cable 403 carries DC power provided at the input $DC_{IN}$ to the signal booster 403 as well as RF signals associated with communications of the mobile station antenna 15. In certain implementations, the input $DC_{IN}$ receives a DC voltage from a vehicle's power source.

Although one embodiment of circuitry for connecting to a shared DC power and RF cable is shown, other implementations are possible.

Figure 9:
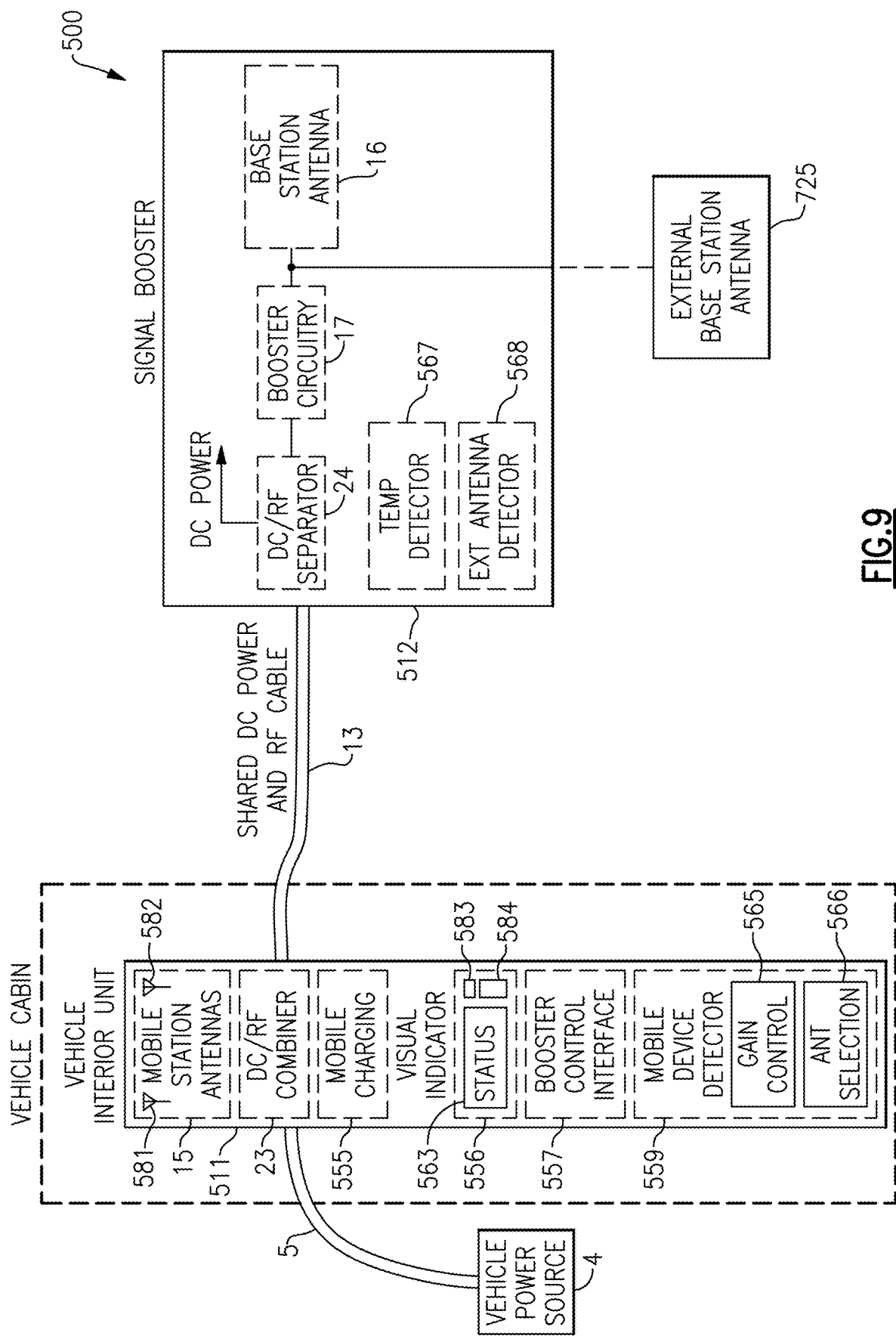
FIG. 9 is a schematic diagram of a vehicle signal booster system according to another embodiment.

FIG. 9 is a schematic diagram of a vehicle signal booster system 500 according to another embodiment. The vehicle signal booster system 500 includes a vehicle interior unit 511, a signal booster 512, a shared DC power and RF cable 13, and a power cable 5. As shown in FIG. 9, the vehicle interior unit 511 includes mobile station antennas 15 (at least two, in this embodiment), a DC/RF combiner 23, a mobile charging circuit 555, a visual indicator 556, a booster control interface 557, and a mobile device detector 559. Additionally, the signal booster 512 includes a base station antenna 16, booster circuitry 17, a DC/RF separator 24, a temperature detector 567, and an external antenna detector 568.

The mobile charging circuit 555 is operable to charge a battery of a user's mobile device. In one example, a charging cable is provided from the vehicle interior unit 511 to the mobile device, and the charging circuit 555 charges the mobile device's battery via the charging cable. In another example, a mobile device can be coupled to the vehicle interior unit 511 and the mobile charging circuit 555 provides wireless charging.

The visual indicator 556 can include one or more displays, lights, or other visual indications to alert a user to the status of operation of the vehicle signal booster system 500. In one embodiment, the visual indicator 556 includes at least one of a light-emitting diode (LED) or a display, such as a liquid crystal display (LCD).

In the illustrated embodiment, the visual indicator 556 includes a status indicator 563, which indicates the status of the vehicle signal booster system 500, including, but not limited to, whether boosting is active for one or more bands, antenna status, whether oscillation/pre-oscillation has occurred, a temperature as detected by the signal booster's temperature detector, and/or whether the booster is operating with backed-off performance because of high temperature. In one embodiment, a temperature alarm is alerted when a high temperature condition is present.

The booster control interface 557 can be used to control the vehicle signal booster system 500 in a wide variety of ways. Examples of types of control provided by the booster control interface 557 include, but are not limited to, remote shut-down or power control, remote control of gain and/or attenuation (including, for example, band specific control), and/or remote control of antenna selection. Including the booster control interface 557 allows a user inside the vehicle cabin to control the signal booster 512, which may be inconvenient for the user to access. In one embodiment, a touch screen display is provided to both implement the visual indicator 556 and the booster control interface 557.

The mobile device detector 559 operates to detect whether or not a mobile device is attached (for instance, cradled) to the vehicle interior unit 511. For example, the mobile device detector 559 can include a proximity sensor or other suitable detector for detecting presence of the mobile device.

As shown in FIG. 9, the mobile device detector 559 includes a gain control circuit 565 and an antenna selection circuit 566 for controlling at least one of a gain or a selected mobile station antenna based on whether or not the mobile device is detected. For example, under certain current consumer booster specifications, signal boosting can be limited to about 50 dB of gain when using a radiating antenna inside of a car and to about 23 db of gain when using a coupling type antenna inside of the car. In one embodiment, the mobile station antennas 15 include at least one coupling type antenna and at least one radiating type antenna.

The illustrated vehicle interior unit 511 provides dynamic antenna selection and gain control based on whether or not a mobile device is attached to the mount. For example, a first type of antenna and a first amount of gain can be used when the mobile device is cradled, and a second type of antenna and a second amount of gain can be used when the mobile device is not present. For instance, a coupling type antenna 581 and 23 dB of gain can be used when the mobile device is cradled, and a radiating antenna 582 and 50 dB of gain can be used when the mobile device is removed from the mount.

The signal booster 512 includes the temperature detector 567, which detects temperature. In one embodiment, when a high temperature condition is detected (for instance, a temperature of about 120 degrees Fahrenheit or higher), the signal booster 512 automatically adjusts performance (for instance, decreases gain) to protect from overheating. Such backed-off performance can be communicated to the user via the visual indicator 556.

The external antenna detector 568 detects whether or not an external base station antenna 725 has been connected to the signal booster 512. In one embodiment, when the external antenna detector 568 detects that the external base station antenna 725 is connected, the external antenna detector 568 disables the integrated base station antenna 16 in favor of using the external base station antenna 725 for communications. When the external base station antenna 725 is present, the signal booster 512 can detect output power of the antenna (for instance, via directional couplers or other feedback paths) to ensure that output power does not exceed FCC EIRP limits and/or other emissions regulations or specifications. Accordingly, in certain implementations, the external antenna detector 568 provides at least one of antenna selection or gain control based on whether or not the external antenna is detected.

Figure 10:
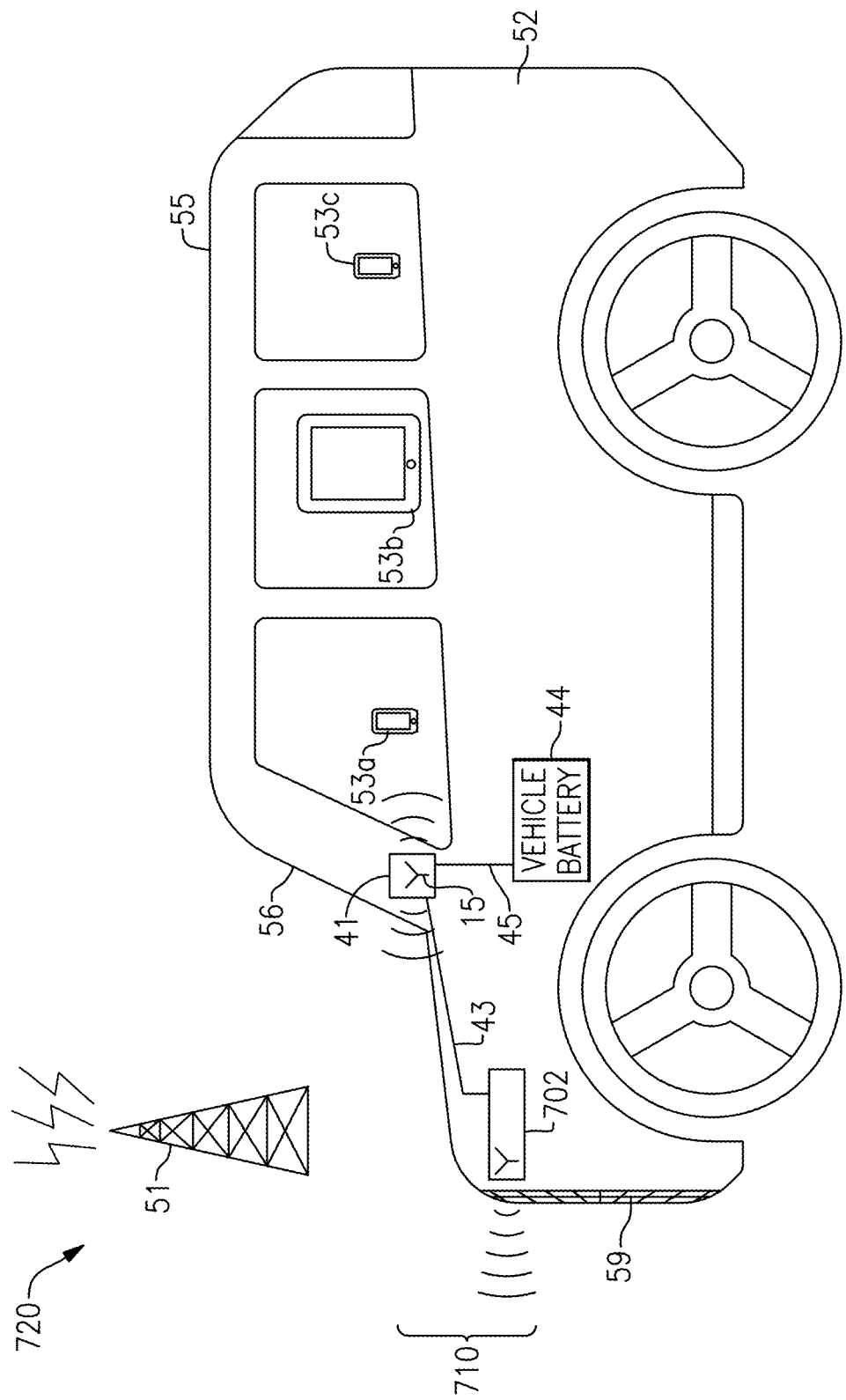
FIG. 10 is a schematic diagram of a mobile network according to another embodiment.

FIG. 10 is a schematic diagram of a mobile network 720 according to another embodiment. The mobile network 720 includes a vehicle signal booster system 710, a base station 51, and mobile devices 53*a*-53*c* (three shown, in this example). The vehicle signal booster system 710 includes a vehicle interior unit 41, a signal booster 702, a power and RF cable 43, and a power cable 45. For clarity of the figures, only a portion of the internal circuitry and components of the vehicle interior unit 41 and the signal booster 702 are shown in FIG. 10.

The signal booster 702 of FIG. 10 includes an integrated directional antenna, and is installed behind a grill 59 of the vehicle 52. The signal boosters herein can be installed in a wide variety of locations.

FIG. 11A is a schematic diagram of another embodiment of booster circuitry 800. The booster circuitry 800 of FIG. 11A corresponds to one embodiment of booster circuitry suitable for use in the signal booster systems disclosed herein. However, the signal booster systems herein can include other implementations of booster circuitry. The booster circuitry 800 can operate using a wide variety of frequency bands and communication standards including, but not limited to, any of the frequency bands and communications standards described herein.

In the illustrated embodiment, the booster circuitry 800 includes a first splitting/combining structure 801 and a second splitting/combining structure 802, which can be implemented in a wide variety of ways, including, but not limited to, using one or more multiplexers, one or more diplexers, and/or other suitable components for splitting and combining RF signals. The booster circuit 800 further includes a group of uplink amplification circuits 811*a*, 811*b*, . . . 811*m* and a group of downlink amplification circuits 812*a*, 812*b*, . . . 812*n*.

In this embodiment, m uplink amplification circuits and n uplink amplification circuits are included in the booster circuitry 800. The values of m and n can vary with application and/or implementation, and can be the same or different value.

As shown in FIG. 11A, the first splitting/combining structure 801 receives an uplink signal (UL) and outputs an amplified downlink signal ($DL_{AMP}$). Additionally, the second splitting/combining structure 802 receives a downlink signal (DL) and outputs an amplified uplink signal ($UL_{AMP}$).

In certain implementations, the first splitting/combining structure 801 splits the received uplink signal (UL) into multiple uplink channel signals associated with uplink channels of multiple frequency bands. For example, each uplink channel signal can have a frequency range corresponding to the frequency range of an uplink channel of a particular frequency band. Additionally, the uplink amplification circuits 811*a*, 811*b*, . . . 811*m* amplify the uplink channel signals to generate amplified uplink channel signals, which are combined by the second splitting/combining structure 802 to generate the amplified uplink signal ($UL_{AMP}$).

Additionally, the second splitting/combining structure 802 splits the received downlink signal (DL) into multiple downlink channel signals associated with downlink channels of the frequency bands. For example, each downlink channel signal can have a frequency range corresponding to the frequency range of a downlink channel of a particular frequency band. Additionally, the downlink amplification circuits 812*a*, 812*b*, . . . 812*n* amplify the downlink channel signals to generate amplified downlink channel signals, which are combined by the first splitting/combining structure 801 to generate the amplified downlink signal ($DL_{AMP}$).

FIG. 11B is a schematic diagram of another embodiment of booster circuitry 820. The booster circuitry 820 of FIG. 11B corresponds to one embodiment of booster circuitry suitable for use in the signal booster systems disclosed herein. However, the signal booster systems herein can include other implementations of booster circuitry.

In the illustrated embodiment, the booster circuitry 820 includes a first splitting/combining structure 821, which includes a first diplexer 841, a first multiplexer 851, and a second multiplexer 852. Additionally, the booster circuitry 820 includes a second splitting/combining structure 822, includes a second diplexer 842, a third multiplexer 853, and a fourth multiplexer 854.

The booster circuit 820 further includes a first group of uplink amplification circuits 811*a*, 811*b*, . . . 811*m*, a first group of downlink amplification circuits 812*a*, 812*b*, . . . 812*n*, a second group of uplink amplification circuits 831*a*, 831*b*, . . . 831*p*, and a second group of downlink amplification circuits 832*a*, 832*b*, . . . 832*q*. The values of m, n, p, and q can vary with application and/or implementation, and can be the same or different value.

In certain implementations, the first group of uplink amplification circuits 811*a*, 811*b*, . . . 811*m* and the first group of downlink amplification circuits 812*a*, 812*b*, . . . 812*n* provide amplification to signals of one or more low frequency bands, such as frequency bands have a frequency of 1 GHz or less. Additionally, the second group of uplink amplification circuits 831*a*, 831*b*, . . . 831*p* and the second group of downlink amplification circuits 832*a*, 832*b*, . . . 832*q* provide amplification to signals of one or more high frequency bands, such as frequency bands have a frequency greater than 1 GHz.

FIG. 12 is a schematic diagram of one embodiment of an amplification circuit 900. The amplification circuit or path 900 of FIG. 12 illustrates one embodiment of an amplification circuit suitable for use as an uplink amplification circuit or downlink amplification circuit of a signal booster's booster circuitry. However, booster circuitry can include uplink and downlink amplification circuits implemented in a wide variety of ways. Accordingly, other implementations are possible.

In the illustrated embodiment, the amplification circuit 900 includes a low noise amplifier 901, a controllable attenuator 902, a band filter 903, a power amplifier 904, and a power detector 905.

In certain implementations, the detected power by the power detector 905 is provided to control circuitry 908 (for instance, a microprocessor, microcontroller, computer processing unit (CPU), and/or other suitable control circuitry). The control circuitry 908 can use the detected power for a wide variety of functions, including, but not limited to, power control (for instance, automatic gain control), oscillation detection, and/or shutdown. In certain implementations, the control circuitry also provides control over gain of components of one or more RF amplification paths. For example, the control circuitry can control the attenuation provided by controllable attenuation components (for instance, digital step attenuators and/or voltage variable attenuators) and/or the gain provided by controllable amplification circuits (for instance, variable gain amplifiers and/or programmable gain amplifiers).

In certain implementations, the control circuitry 908 is shared by multiple uplink amplification circuits and/or downlink amplification circuits. For example, the control circuitry 908 can correspond to a processing chip (for instance, a microprocessor chip, microcontroller chip, or CPU chip) that provides centralized control of the signal booster system.

Figure 13:
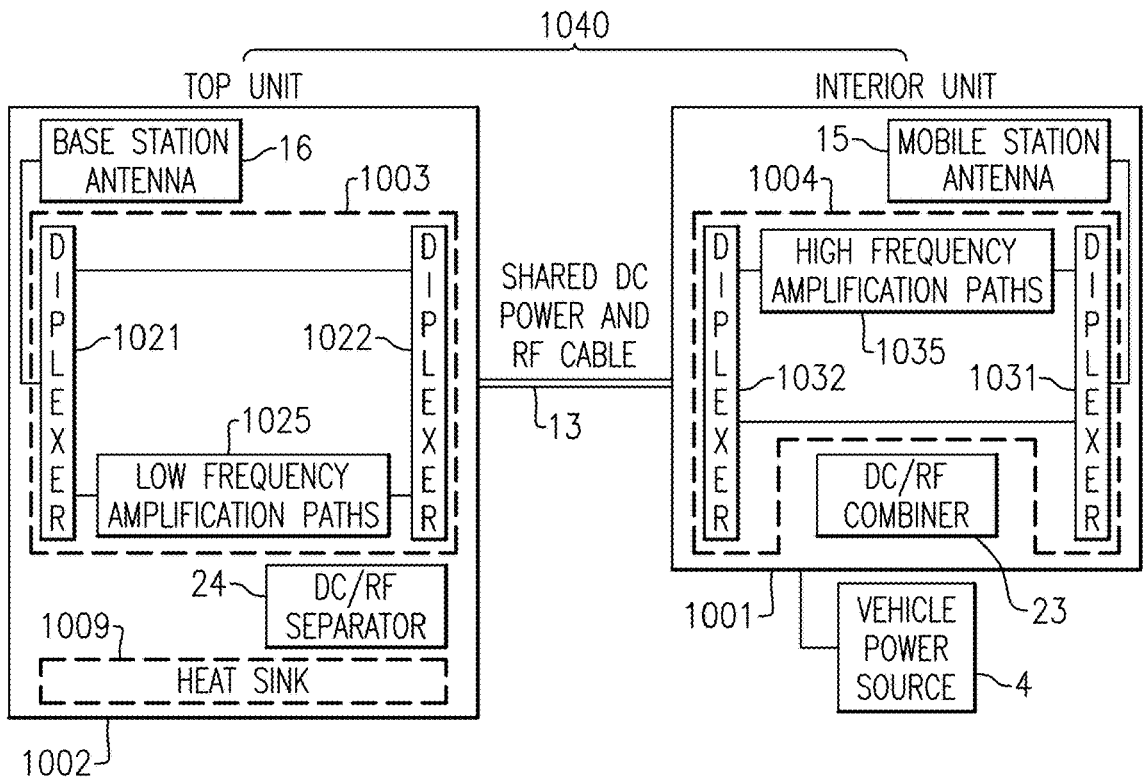
FIG. 13 is a schematic diagram of a vehicle signal booster system according to another embodiment.

FIG. 13 is a schematic diagram of a vehicle signal booster system 1040 according to another embodiment. The vehicle signal booster system 1040 includes an interior unit 1001, a top unit 1002, a shared DC power and RF cable 13, and a vehicle power source 4.

The top unit 1002 is configured for attachment to a top of a vehicle (for instance, an exterior surface of a vehicle roof), and corresponds to one embodiment of a signal booster. The top unit 1002 can be attached in a wide variety of ways, including but not limited to, using magnets, using mechanical fasteners, using adhesive (for instance, a metal plate glued to a roof), and/or integrated into a roof of a vehicle. In the illustrated embodiment, the top unit 1002 includes a base station antenna 16, a first booster circuit 1003, a DC/RF separator 24, and a heat sink 1009. Additionally, the first booster circuit 1003 includes a first diplexer 1021, a second diplexer 1022, and low frequency amplification circuitry or paths 1025.

The interior unit 1001 is configured to placement in a cabin of a vehicle. As shown in FIG. 13, the interior unit 1001 receives power from the vehicle power source 4, and is connected to the top unit 1002 by way of the shared DC power and RF cable 13. In the illustrated embodiment, the interior unit 1001 includes a mobile station antenna 15, a DC/RF combiner 23, and a second booster circuit 1004. Additionally, the second booster circuit 1004 includes a first diplexer 1031, a second diplexer 1032, and high frequency amplification circuitry or paths 1035.

As shown in FIG. 13, a first portion of the system's booster circuitry has been included in the top unit 1002 and a second portion of the system's booster circuitry has been included in the interior unit 1001.

In the illustrated embodiment, the top unit 1002 includes the base station antenna 16, which wirelessly receives a downlink signal. Additionally, the first diplexer 1021 separates the downlink signal into a high frequency downlink signal and a low frequency downlink signal, each of which includes signal frequency content of one or more frequency bands, such as 3GPP bands. In one embodiment, high frequency refers to RF signals greater than 1 GHz, and low frequency refers to RF signals of less than 1 GHz.

The low frequency amplification circuitry 1025 amplifies the low frequency downlink signal to generate an amplified low frequency downlink signal that is provided to the interior unit 1001 over the shared DC power and RF cable 13. The first booster circuit 1003 also receives a low frequency uplink signal from the shared DC power and RF cable 13, and the low frequency amplification circuitry 1025 amplifies the low frequency uplink signal to generate an amplified low frequency uplink signal that is provided to the base station antenna 16 for wireless transmission. As shown in FIG. 13, the first booster circuit 1003 does not provide amplification to high frequency signals, in this embodiment.

With continuing reference to FIG. 13, the interior unit 1001 includes the mobile station antenna 15, which wirelessly receives an uplink signal. The first diplexer 1031 separates the uplink signal into a high frequency uplink signal and a low frequency uplink signal, each of which includes one or more frequency bands. The high frequency amplification circuitry 1035 amplifies the high frequency uplink signal to generate an amplified high frequency uplink signal that is provided to the top unit 1002 over the shared DC power and RF cable 13. The second booster circuit 1004 also receives a high frequency downlink signal from the shared DC power and RF cable 13, and the high frequency amplification paths 1035 amplify the high frequency downlink signal to generate an amplified high frequency downlink signal that is provided to the mobile station antenna 15 for wireless transmission. As shown in FIG. 13, the second booster circuit 1004 does not provide amplification to low frequency signals, in this embodiment. Thus, the low frequency signal processing circuitry of the second booster circuit 1004 is passive.

Thus, the top unit 1002 includes booster circuitry for amplifying low frequency RF signals, while the interior unit 1001 includes booster circuitry for amplifying high frequency RF signals. Implementing the vehicle signal booster system in this manner can provide a number of advantages. For example, providing low frequency signal amplification on the vehicle roof can enhance sensitivity in receiving a low frequency downlink signal, thereby improving dialing success rate and connection quality. For example, the low frequency downlink signal can be amplified prior to downlink signal loss arising from the shared DC power and RF cable 13. Moreover, the low frequency amplification circuitry 1025 is isolated from the high frequency amplification circuitry 1035, and thus enhanced isolation is achieved.

The top unit 1002 includes the heat sink 1009, which transfers heat to the roof of the vehicle to provide cooling. In certain implementations, the heat sink 1009 includes metal. In certain implementations, the top unit 1002 is implemented in a water resistant or waterproof housing, which includes the heat sink 1009, the base station antenna 16, the DC/RF separator 24, and the first booster circuit 1003 therein.

In the illustrated embodiment, the base station antenna 16 in integrated with the top unit 1002. However, other configurations are possible, such as implementations in which an omnidirectional antenna and/or directional antenna is separated from the top unit 1002. The DC/RF separator 24 separates DC power and RF signals, and can be implemented in a wide variety of ways including, but not limited to, the configuration shown in FIG. 8.

The interior unit 1001 can be implemented in a wide variety of ways, including, but not limited to, using any of the vehicle interior unit configurations discussed above. In the illustrated embodiment, the mobile station antenna 15 in integrated with the interior unit 1001. However, other configurations are possible, such as implementations in which an omnidirectional antenna and/or directional antenna is separated from the interior unit 1001. The DC/RF combiner 23 can be implemented in a wide variety of ways, including, but not limited to, the configuration shown in FIG. 8.

Although an embodiment in which splitting/combining is provided using diplexers, any suitable splitting/combining structures can be used. Accordingly, other implementations of signal splitting/combining are possible.

Figure 14:
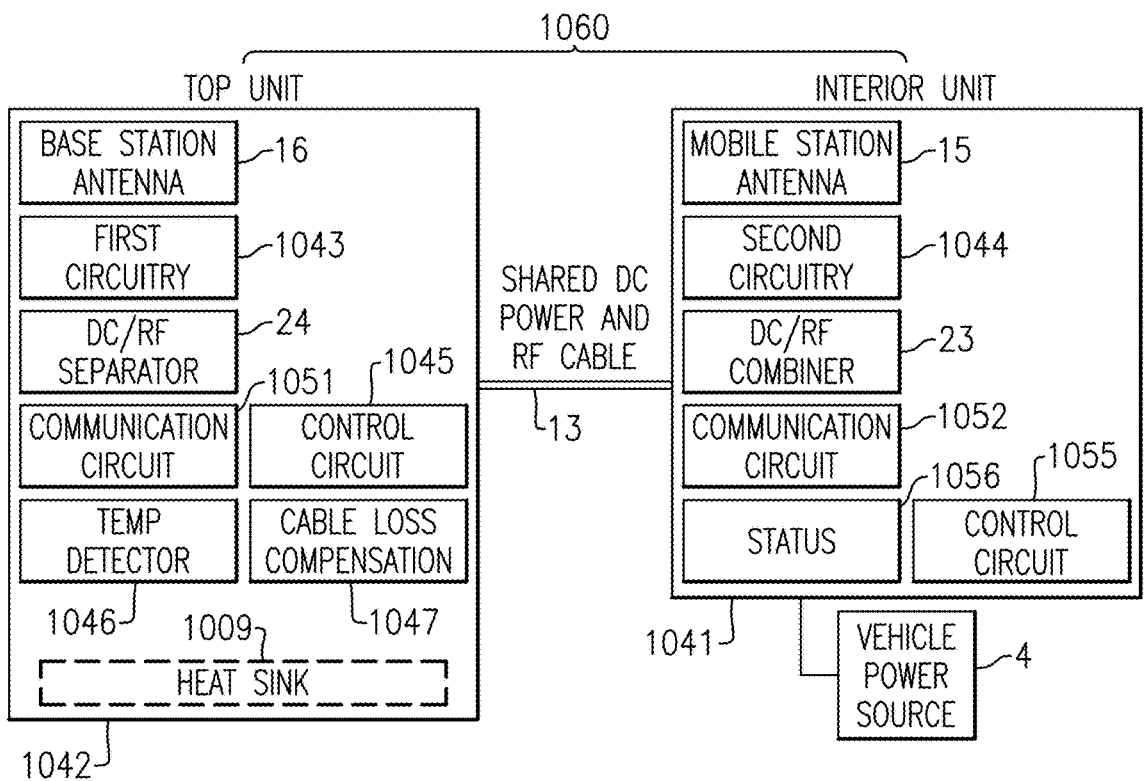
FIG. 14 is a schematic diagram of a vehicle signal booster system according to another embodiment.

FIG. 14 is a schematic diagram of a vehicle signal booster system 1060 according to another embodiment. The vehicle signal booster system 1060 includes an interior unit 1041, a top unit 1042, a shared DC power and RF cable 13, and a vehicle power source 4.

In the illustrated embodiment, the top unit 1042 includes a base station antenna 16, first booster circuitry 1043, a DC/RF separator 24, a communication circuit 1051, a control circuit 1045, a temperature detector 1046, a cable loss compensation circuit 1047, and a heat sink 1009. Additionally, the interior unit 1041 includes a mobile station antenna 15, second booster circuitry 1044, a DC/RF combiner 23, a communication circuit 1052, a control circuit 1055, and a status component 1056.

The first booster circuitry 1043 and the second booster circuitry 1044 can be implemented in a wide variety of ways. In certain implementations, the first booster circuitry 1043 including low frequency amplification circuitry and the second booster circuitry 1044 includes high frequency amplification circuitry, as was discussed above with respect to FIG. 13.

The communication circuit 1051 of the top unit 1042 operates to communicate with the communication circuit 1052 of the interior unit 1041. The communication circuits 1051-1052 can communication with each other in a wide variety of ways including, but not limited to, by signaling over the shared DC power and RF cable 13. Additionally or alternatively, the communication circuits 1051-1052 can communicate with one another over a different cable and/or wirelessly, for instance, via a public frequency band (for instance, 2.4 GHz Wi-Fi).

In certain implementations, the top unit 1042 and the interior unit 1041 are configured to communicate with one another to provide a status check, and to disable signal boosting in response to a failure of the status check. For example, the first communication circuit 1051 and the second communication circuit 1052 can coordinate status check communications, and the control circuits 1045, 1055 can operate to disable at least a portion of the booster circuitry in response to detecting failure of the status check.

The status component 1056 can include indicate status of the vehicle signal booster system 1060. For example, the status component 1056 can include a display for providing visual notifications and/or a speaker for providing audio notifications. In certain implementations, the status component 1056 includes at least one of an indicator light 583 (for instance, one or more light-emitting diodes (LED) or a display 584 (for instance, one or more LED displays) for indicating one or more status conditions. The status component 1056 can indicate a wide variety of status conditions, such as temperature, downlink signal strength, uplink signal strength, automatic gain control status, and/or warnings (for instance, self-oscillation, overheating, failure of a status check, and/or other cautions or alerts). In certain implementations, a user can query a temperature reading of the system or the temperature is continuously displayed.

One or more control functions of the vehicle signal booster system 1060 can be provided in all or part by the control circuits 1045, 1055. In certain implementations, the control circuit 1045 and/or the control circuit 1055 can include a microprocessor, a microcontroller, and/or other digital processing circuit.

In certain implementations, the interior unit 1041 includes one or more buttons, knobs, touch screens, or other user-input interface for allowing a user to input data to provide gain adjustment and/or other control of the vehicle signal booster system 1060.

In this embodiment, the top unit 1042 includes the temperature detector 1046 that detects the temperature of the top unit 1042. The detected temperature can be used in a wide variety of ways, for example, provided to the status component 1056 for display and/or processed by the vehicle signal booster system 1060 to control signal booster power and/or to provide automatic shutdown to prevent overheating.

In one embodiment, when the detected temperature indicates a warm state (for instance, when temperature reaches a threshold), the control circuit 1045 and/or the control circuit 1055 operates the vehicle signal booster system 1060 in an intelligent power adjustment mode in which the booster circuitry operates at backed-off power to reduce heating. Accordingly, certain control circuits herein lower gain in response to an increase in detected temperature.

The cable loss compensation circuit 1047 operates to provide gain control over the first booster circuitry 1043 and/or the second booster circuitry 1044 to provide compensation for downlink signal loss and/or uplink signal loss arising from loss of the shared DC power and RF cable 13 and/or other components of the vehicle signal booster system 1060.

In certain implementations, the cable loss compensation circuit 1047 includes data (for instance, data programmed into a non-volatile memory or stored in fuses or anti-fuses) indicating an amount of cable loss compensation to provide for a particular vehicle. For example, the cable loss compensation can be tailored for a particular vehicle type (for instance, a car model and/or make) and/or an installation line length of the cable 13 (for instance, due to different installation locations of the interior unit 1041 and/or the top unit 1042).

Additionally or alternatively, the cable loss compensation circuit 1047 can adjust the gain of the over the first booster circuitry 1043 and/or the second booster circuitry 1044 to compensate for a measured amount of cable loss. In one example, the first communication circuit 1051 sends a test signal of a particular transmit power to the communication circuit 1052 via the cable 13, or vice versa. Additionally, the communication circuit that receives the test signal and measures the received power, and compensation is provided based on a comparison of the transmit power to the received power.

By including the cable loss compensation circuit 1047, boosting at or near regulatory limits can be achieved. Thus, wireless communication can successfully occur at greater ranges, at higher data rates, and/or in noisier radio environments.

In one embodiment, the top unit 1042 and the interior unit 1041 communicate with one another through demodulation and modulation of RF signals.

FIG. 15A is a schematic diagram of low frequency amplification circuitry or paths 1110 according to one embodiment. The low frequency amplification circuitry 1110 includes a downlink amplification path or circuit 1105, a first uplink amplification path or circuit 1107, a second uplink amplification path 1108, a first multiplexer 1101, and a second multiplexer 1102. In one embodiment, the low frequency amplification circuitry 1110 provides amplification to RF signals of less than 1 GHz.

The low frequency amplification circuitry 1110 can be implemented in any of the signal booster circuits herein. In one embodiment, the low frequency amplification circuitry 1110 serves as the low frequency amplification circuitry 1025 of FIG. 13, with the first multiplexer 1101 coupled to the first diplexer 1021 and the second multiplexer 1102 coupled to the second diplexer 1022.

The downlink amplification path 1105 provides amplification to downlink channel(s) of one or more low frequency bands and/or sub-bands, while each of the uplink amplification paths 1107, 1108 provides amplification to uplink channel(s) of one or more low frequency bands and/or sub-bands. In one example, the uplink amplification path 1107 amplifies a Band XII uplink channel, the uplink amplification path 1108 amplifies a Band XIII uplink channel, and the downlink amplification path 1105 simultaneously amplifies a Band XII downlink channel and a Band XIII downlink channel.

Although one example of low frequency amplification circuitry is shown, the teachings herein are applicable to booster circuitry implemented in a wide variety of ways. For example, a booster circuit can include more or fewer uplink paths, downlink paths, and/or include signal separating/combining circuitry implemented in other ways.

FIG. 15B is a schematic diagram of high frequency amplification circuitry or paths 1130 according to one embodiment. The high frequency amplification circuitry 1130 includes a first downlink amplification path 1125, a second downlink amplification path 1126, a first uplink amplification path 1127, and a second uplink amplification path 1128, a first multiplexer 1121, and a second multiplexer 1122. In one embodiment, the high frequency amplification circuitry 1130 provides amplification to RF signals greater than 1 GHz.

The high frequency amplification circuitry 1130 can be implemented in any of the signal booster circuits herein. In one embodiment, the high frequency amplification circuitry 1130 serves as the high frequency amplification circuitry 1035 of FIG. 13, with the first multiplexer 1121 coupled to the first diplexer 1031 and the second multiplexer 1122 coupled to the second diplexer 1032.

Each of the downlink amplification paths 1125, 1126 provides amplification to downlink channel(s) of one or more high frequency bands and/or sub-bands, while each of the uplink amplification paths 1127, 1128 provides amplification to uplink channel(s) of one or more high frequency bands and/or sub-bands.

Although one example of high frequency amplification circuitry is shown, the teachings herein are applicable to booster circuitry implemented in a wide variety of ways. For example, a booster circuit can include more or fewer uplink paths, downlink paths, and/or include signal separating/combining circuitry implemented in other ways.

FIG. 16A is a schematic diagram of an RF amplification path 1210 according to another embodiment. The RF amplification path 1210 includes a low noise amplifier 1201, a controllable attenuator 1202, a band filter 1203, a directional coupler 1204, a power detector 1205, and a power amplifier 1206. The RF amplification path 1210 illustrates one implementation of circuitry suitable for use in a downlink amplification path or uplink amplification path. However, an RF amplification path can include circuitry implemented in a wide variety of ways.

In certain implementations, the detected power by the power detector 1205 is provided to control circuitry (for instance, the control circuit 1045 and/or the control circuit 1055 of FIG. 14). The control circuitry can use the detected power for a wide variety of functions, including, but not limited to, power control (for instance, automatic gain control), oscillation detection, and/or shutdown. In certain implementations, the control circuitry also provides control over gain of components of RF amplification paths. For example, the control circuitry can control the attenuation provided by controllable attenuation components (for instance, digital step attenuators and/or voltage variable attenuators) and/or the gain provided by controllable amplification circuits (for instance, variable gain amplifiers and/or programmable gain amplifiers).

FIG. 16B is a schematic diagram of a radio frequency amplification path 1230 according to another embodiment. The RF amplification path 1230 includes a low noise amplifier 1211, a first band filter 1212, a downconverting mixer 1213, a first variable gain amplifier 1214, a controllable attenuator 1215, a low pass filter 1216, a second variable gain amplifier 1217, a frequency upconverting mixer 1218, a second band filter 1219, a directional coupler 1220, a power detector 1221, and a power amplifier 1222. The RF amplification path 1230 illustrates another implementation of circuitry suitable for use in a downlink amplification path or uplink amplification path. However, an RF amplification path can include circuitry implemented in a wide variety of ways.

FIG. 16C is a schematic diagram of a radio frequency amplification path 1260 according to another embodiment. The radio frequency amplification path 1260 includes a low noise amplifier 1241, a first band filter 1242, a frequency downconverting mixer 1243, a first variable gain amplifier 1244, a digital filter 1245, a second variable gain amplifier 1246, a frequency upconverting mixer 1247, a second band filter 1248, a directional coupler 1249, a power detector 1250, and a power amplifier 1251. The RF amplification path 1260 illustrates another implementation of circuitry suitable for use in a downlink amplification path or uplink amplification path. However, an RF amplification path can include circuitry implemented in a wide variety of ways.

Figure 17A:
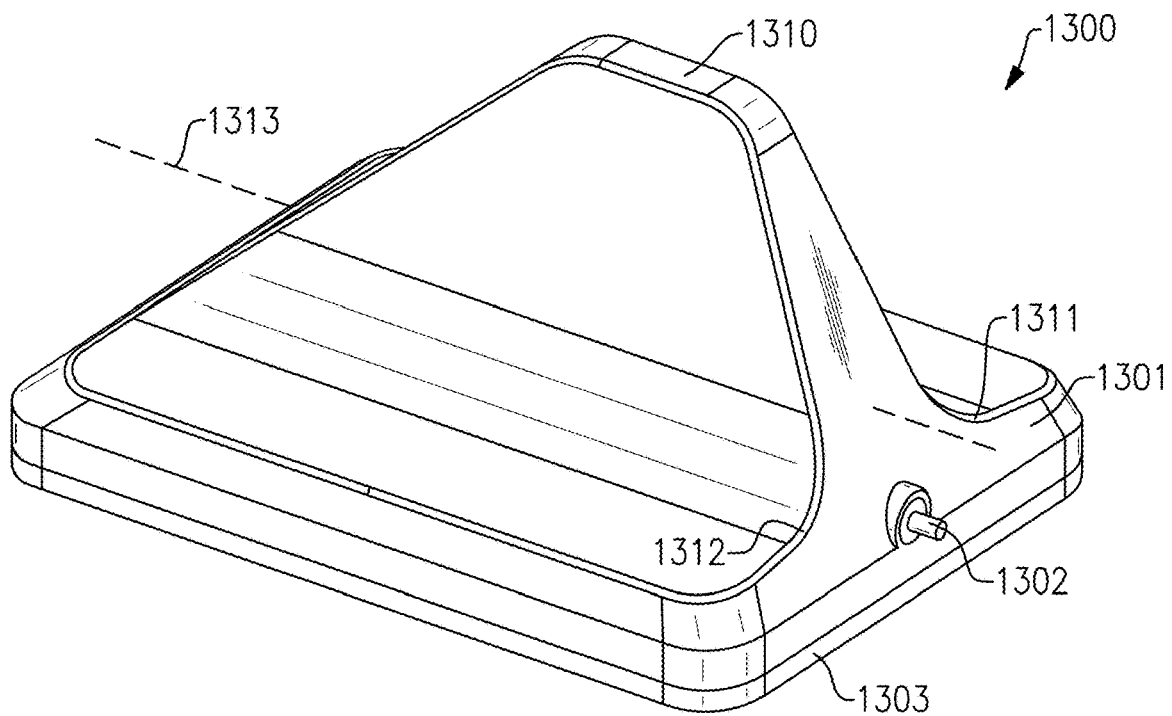
FIG. 17A is a schematic diagram of another embodiment of a top unit for a vehicle.
Figure 17B:
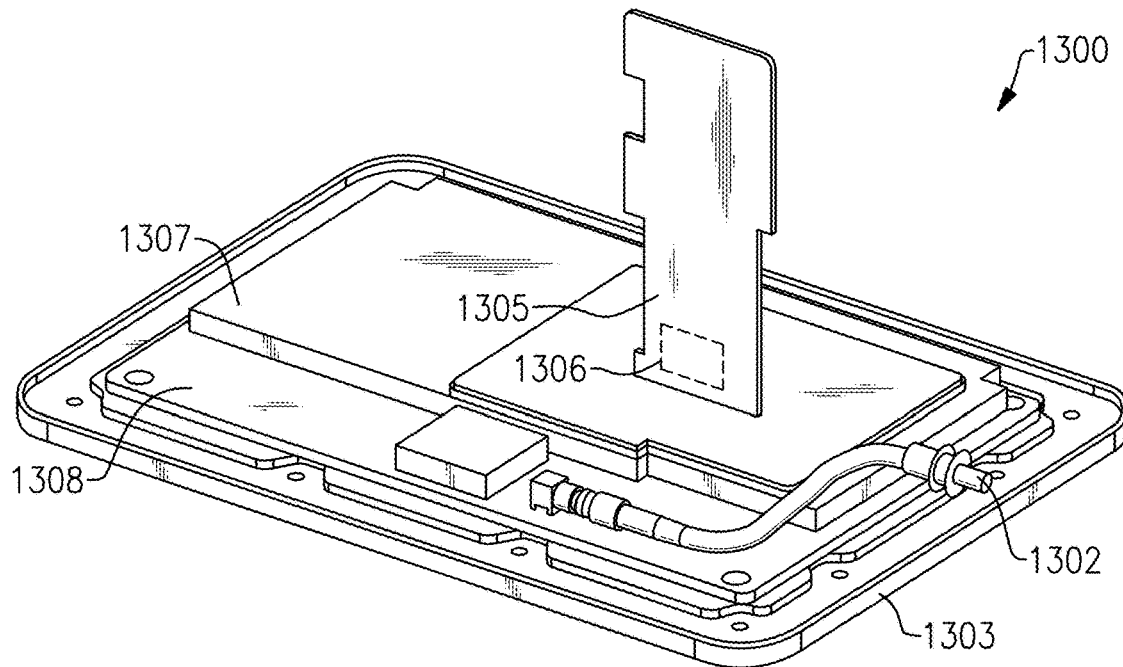
FIG. 17B is a schematic diagram of the top unit of FIG. 17A with the cover removed.

FIG. 17A is a schematic diagram of another embodiment of a top unit 1300 for a vehicle. The top unit 1300 includes a cover 1301 and a cable port 1302 for connecting to a cable (for example, a shared DC power and RF cable). FIG. 17B is a schematic diagram of the top unit 1300 of FIG. 17A with the cover 1301 removed. The cover 1301 is implemented with an aerodynamic shape, to reduce wind resistance when attached to a vehicle's roof. For example, the cover 1301 has a streamlined design to reduce air drag. For instance, the cover 1301 includes a fin 1310 having a first curved surface 1311 and a second curved surface 1312, and is substantially mirror symmetric about an axis 1313 when the top unit 1300 is viewed from above. In certain implementations, the cover 1301 includes plastic.

As shown in FIGS. 17A and 17B, the cover 1301 connects to a base 1303 to thereby form a housing for the components and circuitry of the top unit 1300. The top unit 1300 includes a shielding structure 1307, which includes booster circuit therein (for instance, implemented on a printed circuit board within the shielding structure 1307).

In the illustrated embodiment, an antenna board 1305 is included within a cavity of the top unit's housing. The antenna board 1305 includes a base station antenna thereon. In one embodiment, circuitry 1306 is integrated with the base station antenna on the antenna board 1305.

The top unit 1300 also includes a base 1308, which can include metal for transfer of heat. In certain implementations, the top unit 1300 includes one or more magnets and/or at least a portion of the base 1308 is magnetic to aid in securing the top unit 1300 to a vehicle roof.

In certain implementations, a base station antenna extends vertically from a metal base of a top unit. For example, the antenna board 1305 is substantially perpendicular to the metal base 1308, in this embodiment. By implementing a base station antenna to extend vertically from a metal base, the metal base is operable to provide electromagnetic reflection.

The top unit 1300 can be secured to a vehicle's roof in a wide variety of way. In one embodiment, at least one of an adhesive or a magnet secures the top unit 1300 to the vehicle roof's via the base 1303.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A signal booster system comprising:
   a first unit configured to receive a radio frequency (RF) downlink signal from a base station antenna and to provide a boosted RF uplink signal to the base station antenna for wireless transmission, wherein the first unit comprises a first booster circuit; and
   a second unit configured to connect to the first unit by a cable, wherein the second unit is configured to receive an RF uplink signal from a mobile station antenna and to provide a boosted RF downlink signal to the mobile station antenna for wireless transmission, wherein the second unit comprises a second booster circuit configured to separate the RF uplink signal into a high frequency uplink signal and a low frequency uplink signal, wherein the second unit amplifies the high frequency uplink signal but does not amplify the low frequency uplink signal.

2. The signal booster system of claim 1, wherein the first booster circuit is configured to separate the RF downlink signal into a high frequency downlink signal and a low frequency downlink signal, wherein the first unit amplifies the low frequency downlink signal but does not amplify the high frequency downlink signal.

3. The signal booster system of claim 2, wherein the second unit amplifies the high frequency downlink signal but does not amplify the low frequency downlink signal.

4. The signal booster system of claim 1, wherein the second booster circuit comprises a first diplexer configured to separate the RF uplink signal into the high frequency uplink signal and the low frequency uplink signal, and high frequency amplification circuitry configured to amplify the high frequency uplink signal to generate an amplified high frequency uplink signal.

5. The signal booster system of claim 4, wherein the second booster circuit further comprises a second diplexer configured to combine the amplified high frequency uplink signal and the low frequency uplink signal for transmission over the cable to the first unit.

6. The signal booster system of claim 5, wherein the high frequency amplification circuitry is further configured to amplify a high frequency downlink signal received from the cable via the second diplexer.

7. The signal booster system of claim 1, wherein the high frequency uplink signal has a frequency greater than 1 GHz, wherein the low frequency uplink signal has a frequency lower than 1 GHz.

8. The signal booster system of claim 1, wherein the first unit amplifies the low frequency uplink signal.

9. The signal booster system of claim 8, wherein the first unit does not amplify the high frequency uplink signal.

10. The signal booster system of claim 1, wherein the cable carries both DC power and RF signals.

11. The signal booster system of claim 1, wherein the first unit is implemented in a housing including a plastic cover and a metal base, wherein the metal base is configured to transfer heat to a metal surface to provide cooling.

12. The signal booster system of claim 1, wherein the second unit is configured to receive DC power from a power source.

13. The signal booster system of claim 12, wherein the second unit comprises a DC/RF combiner configured to combine the RF uplink signal and the DC power for transmission to the first unit via the cable, and the first unit comprises a DC/RF separator configured to separate the RF uplink signal and the DC power received from the cable.

14. The signal booster system of claim 1, wherein the first unit comprises a temperature sensor, wherein the signal booster system is configured to reduce a signal bandwidth in response to the temperature sensor detecting a temperature over a threshold.

15. The signal booster system of claim 1, wherein the first unit is an exterior unit and the second unit is an interior unit.

16. The signal booster system of claim 1, wherein the first booster circuit comprises low frequency amplification circuitry and passive high frequency processing circuitry.

17. The signal booster system of claim 1, wherein the second booster circuit comprises high frequency amplification circuitry and passive low frequency processing circuitry.

18. The signal booster system of claim 1, further comprising the base station antenna and the mobile station antenna.

19. The signal booster system of claim 18, wherein the mobile station antenna is integrated with the second unit, and the base station antenna is integrated with the first unit.

20. The signal booster system of claim 18, further comprising the cable.

* * * * *